United States Patent
Lee et al.

(10) Patent No.: US 10,985,165 B2
(45) Date of Patent: Apr. 20, 2021

(54) METHODS OF FORMING MICROELECTRONIC DEVICES

(71) Applicant: Micron Technology, Inc., Boise, ID (US)

(72) Inventors: Si-Woo Lee, Boise, ID (US); Kyuseok Lee, Boise, ID (US); Sangmin Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/543,799

(22) Filed: Aug. 19, 2019

(65) Prior Publication Data

US 2021/0057418 A1    Feb. 25, 2021

(51) Int. Cl.
*H01L 27/108* (2006.01)
*G11C 5/06* (2006.01)
*H01L 21/768* (2006.01)

(52) U.S. Cl.
CPC ........ *H01L 27/10876* (2013.01); *G11C 5/063* (2013.01); *H01L 21/76877* (2013.01); *H01L 27/10823* (2013.01); *H01L 27/10847* (2013.01); *H01L 27/10873* (2013.01)

(58) Field of Classification Search
CPC ......... H01L 27/10847; H01L 21/76877; H01L 27/10873
See application file for complete search history.

(56) References Cited

U.S. PATENT DOCUMENTS

| 5,866,927 | A  | * | 2/1999  | Cho ................... H01L 21/76895 257/296 |
| 6,835,650 | B1 | * | 12/2004 | McQueen ........... H01L 27/0266 438/631 |
| 9,640,535 | B2 | * | 5/2017  | Niimi .............. H01L 21/823871 |

* cited by examiner

*Primary Examiner* — Syed I Gheyas
(74) *Attorney, Agent, or Firm* — TraskBritt

(57) ABSTRACT

A method of forming a microelectronic device comprises forming a spacer structure having a rectangular ring horizontal cross-sectional shape over a transistor, a portion of the spacer structure horizontally overlapping a drain region of the transistor. A masking structure is formed over the spacer structure and the transistor, the masking structure exhibiting an opening therein horizontally overlapping the drain region of the transistor and the portion of the spacer structure. A portion of an isolation structure overlying the drain region of the transistor is removed using the masking structure and the portion of the spacer structure as etching masks to form a trench vertically extending through the isolation structure to the drain region of the transistor. A drain contact structure is formed within the trench in the isolation structure. Microelectronic devices, memory devices, and electronic systems are also described.

26 Claims, 13 Drawing Sheets

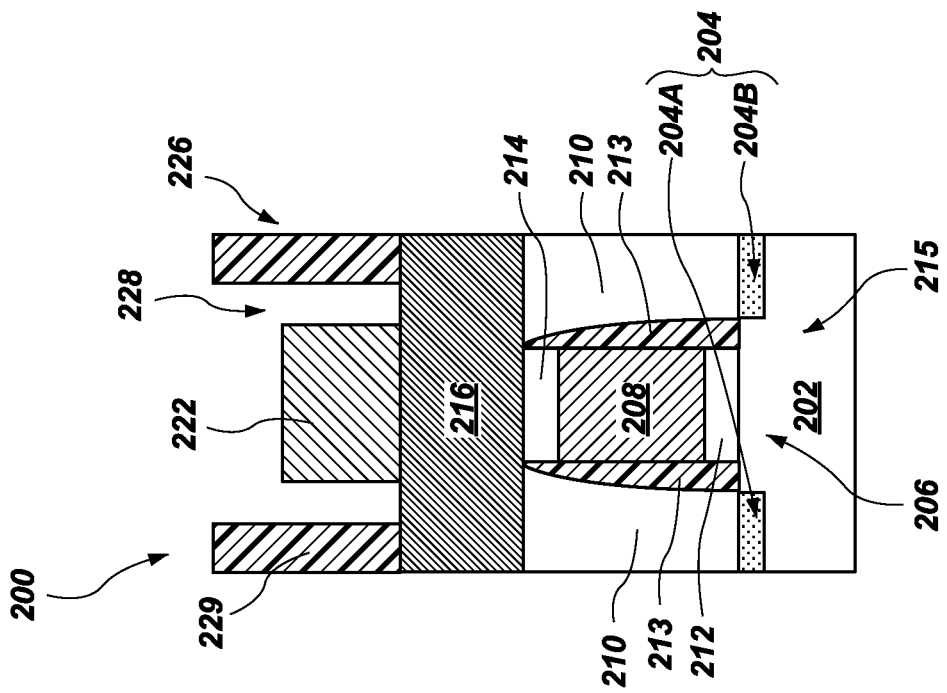
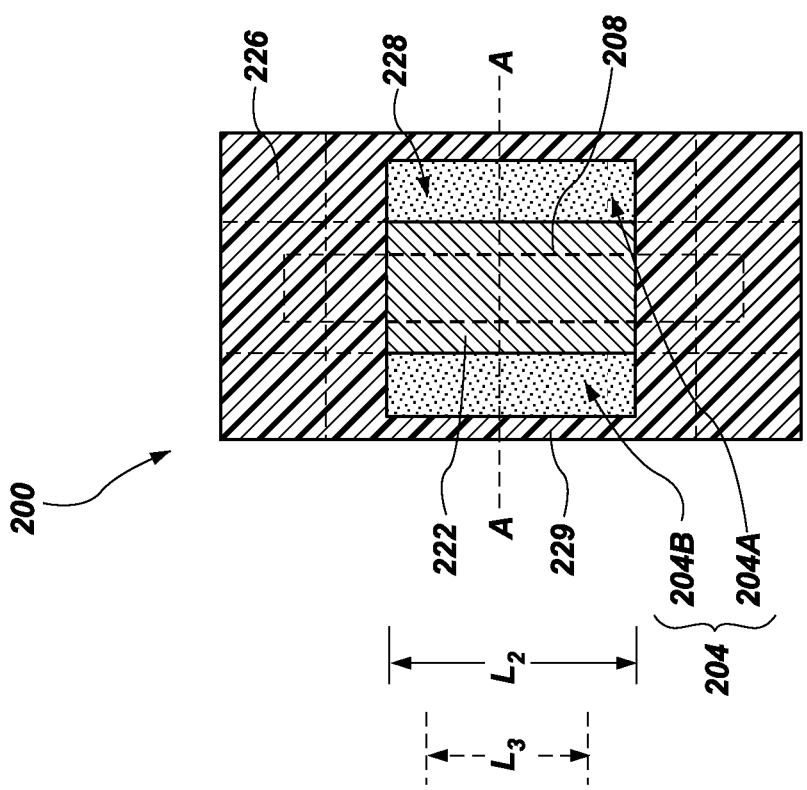
FIG. 6B
FIG. 6A

METHODS OF FORMING MICROELECTRONIC DEVICES

TECHNICAL FIELD

Embodiments of the disclosure relate to the field of microelectronic device design and fabrication. More specifically, embodiments of the disclosure relate to methods of forming microelectronic devices, and to related microelectronic devices, memory devices, and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified designs.

A relatively common microelectronic device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of microelectronic device (e.g., memory device, such as DRAM device) features places ever increasing demands on the methods used to form the microelectronic device features. For example, one of the limiting factors in the continued shrinking of microelectronic devices is the resistance of contact structures associated therewith. As used herein, a "contact structure" of a microelectronic device refers to a structure facilitating an electrically conductive pathway between at least two other features (e.g., structures, regions) of the microelectronic device. As the dimensions of microelectronic device features decrease, the dimensions of the contact structures associated therewith also decrease, resulting in increased contact resistance. Increased contact resistance decreases the drive current of the microelectronic device, which can adversely affect device performance.

A need, therefore, exists for new, simple, and cost-efficient methods of forming microelectronic devices (e.g., memory devices) that alleviate the aforementioned problems, as well as for new microelectronic devices and electronic systems.

BRIEF DESCRIPTION OF THE SEVERAL VIEWS OF THE DRAWINGS

FIGS. 6A through 6B are simplified partial top-down (FIG. 6A) and simplified partial cross-sectional (FIG. 6B) views illustrating a method of forming a microelectronic device, in accordance with additional embodiments of the disclosure.

DETAILED DESCRIPTION

Figure 1A:
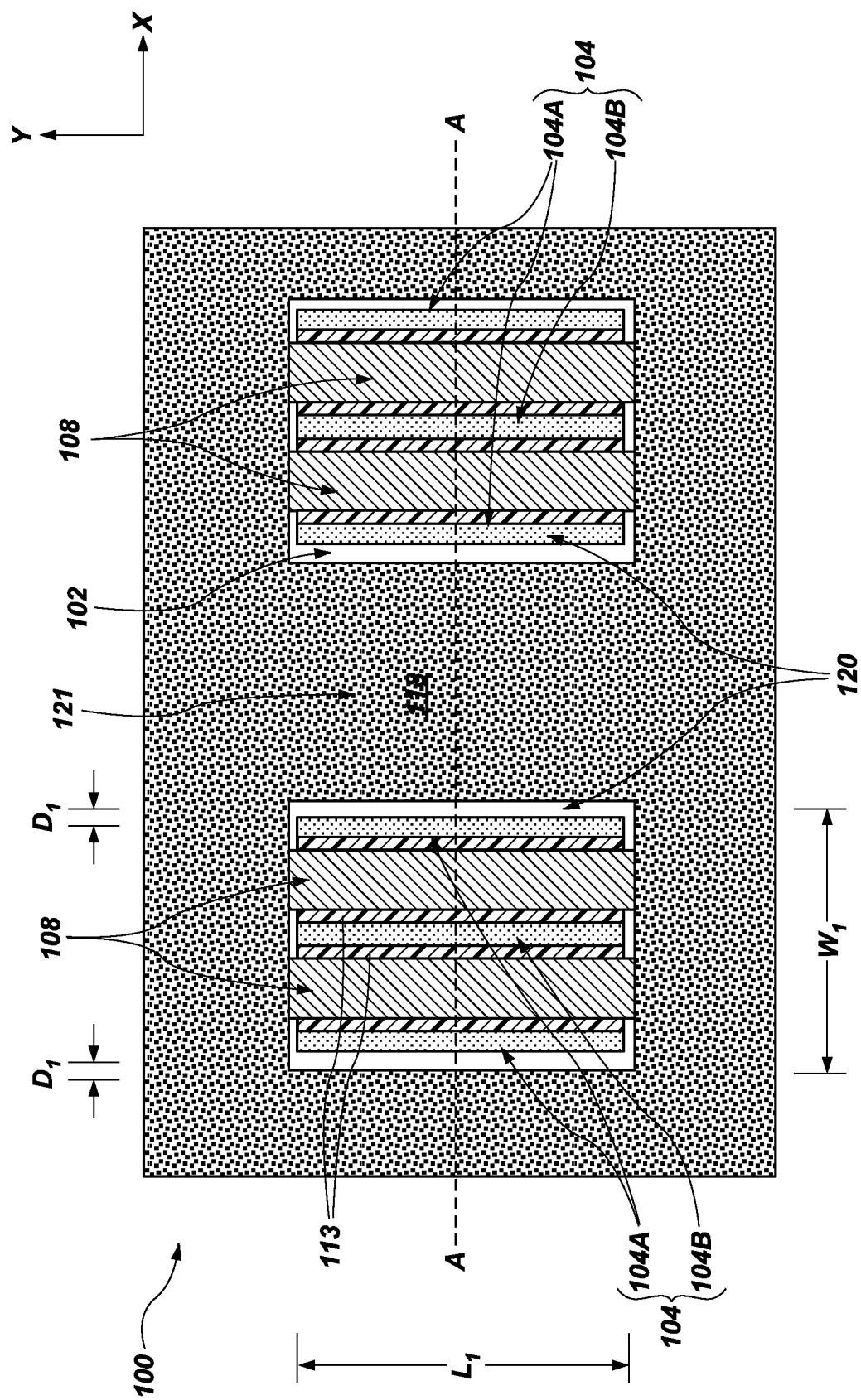
FIGS. 1A through 5B are simplified partial top-down (FIGS. 1A, 2A, 3A, 4A, and 5A) and simplified partial cross-sectional (FIGS. 1B, 2B, 3B, 4B, and 5B) views illustrating a method of forming a microelectronic device, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as DRAM device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the term "configured" refers to a size, shape, material composition, orientation, and arrangement of one or more of at least one structure and at least one apparatus facilitating operation of one or more of the structure and the apparatus in a pre-determined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically-neighboring" or "longitudinally-neighboring" features (e.g., regions, structures, devices) means and includes features located most vertically proximate (e.g., vertically closest) one another. In addition, as used herein, "horizontally-neighboring" or "laterally-neighboring" features (e.g., regions, structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

Unless the context indicates otherwise, the materials described herein may be formed by any suitable process including, but not limited to, spin coating, blanket coating, chemical vapor deposition ("CVD"), atomic layer deposition ("ALD"), plasma enhanced ALD, physical vapor deposition ("PVD") (including sputtering, evaporation, ionized PVD, and/or plasma-enhanced CVD), or epitaxial growth. Depending on the specific material to be formed, the technique for depositing or growing the material may be selected by a person of ordinary skill in the art. In addition, unless the context indicates otherwise, the removal of materials described herein may be accomplished by any suitable process including, but not limited to, etching (e.g., dry etching, wet etching, vapor etching), ion milling, abrasive planarization, development, or other known methods.

FIGS. 1A through 5B are simplified partial top-down (FIGS. 1A, 2A, 3A, 4A, and 5A) and simplified partial cross-sectional (FIGS. 1B, 2B, 3B, 4B, and 5B) views illustrating embodiments of a method of forming a microelectronic device structure (e.g., a memory structure) for a microelectronic device (e.g., a memory device, such as a DRAM device, a RRAM device, a conductive bridge RAM device, an MRAM device, a PCM device, a PCRAM device, a STTRAM device, an oxygen vacancy-based memory device, a programmable conductor memory device). With the description provided below, it will be readily apparent to one of ordinary skill in the art that the methods described herein may be used in various devices. In other words, the methods of the disclosure may be used whenever it is desired to form a microelectronic device.

Figure 1B:
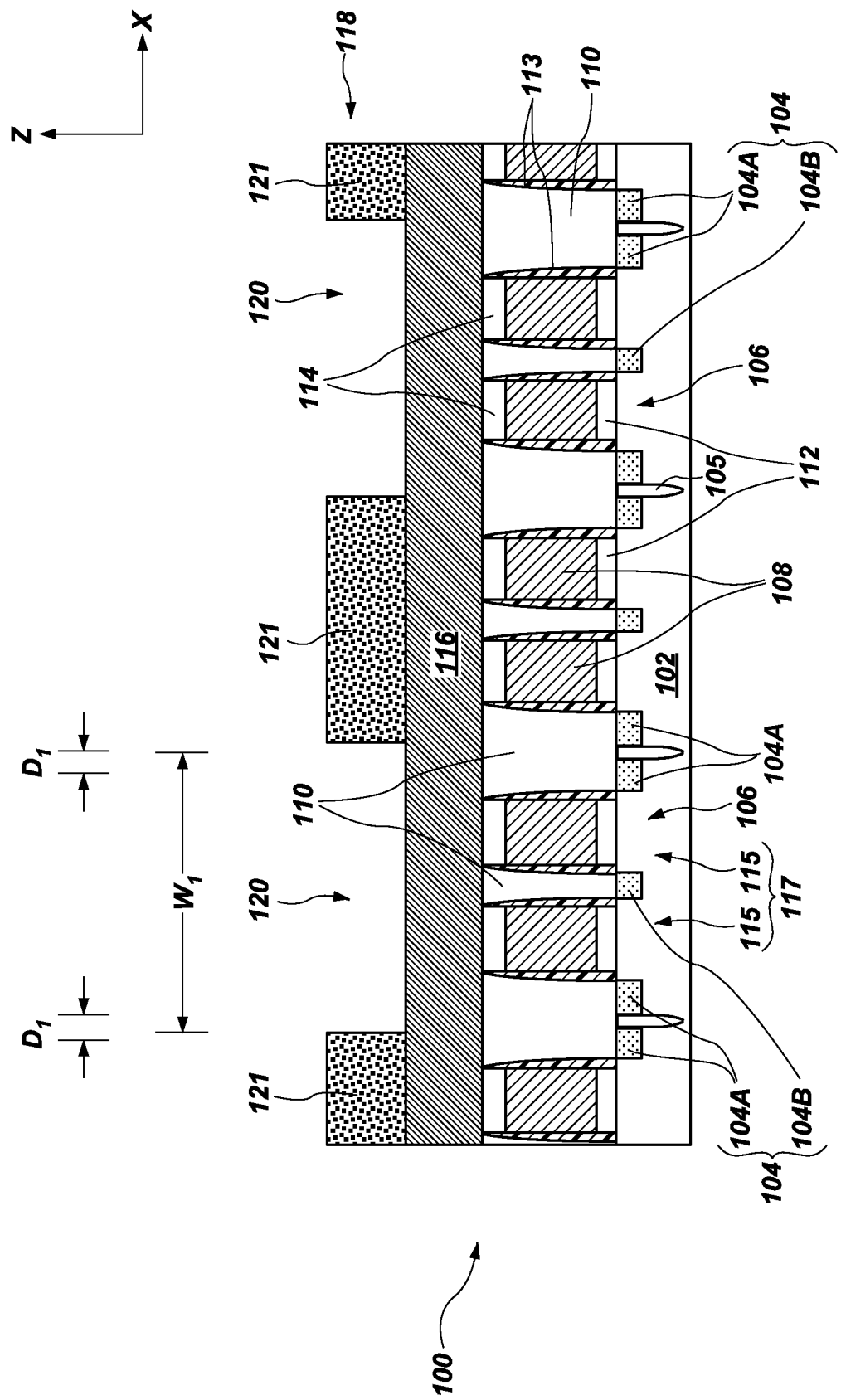

Referring to collectively to FIGS. 1A and 1B (which depict a simplified partial cross-sectional view of the microelectronic device structure 100 about the line A-A shown in FIG. 1A), a microelectronic device structure 100 may be formed to include a base structure 102, gate structures 108 over the base structure 102, isolation structures 110 (FIG. 1B) over the base structure 102 and horizontally between the gate structures 108, a first masking structure 116 (FIG. 1B) over the gate structures 108 and the isolation structures 110, and a second masking structure 118 over the first masking structure 116 (FIG. 1B). The base structure 102, the gate structures 108, the isolation structures 110, the first masking structure 116, and the second masking structure 118 are described in further detail below, along with additional components (e.g., structures, features) of the microelectronic device structure 100 at the processing stage depicted in FIGS. 1A and 1B. For clarity and ease of understanding of the drawings and related description, not all features depicted in one of FIGS. 1A and 1B are depicted in the other of FIGS. 1A and 1B. As a non-limiting example, the first masking structure 116 and the isolation structures 110 shown in FIG. 1B have been omitted from FIG. 1A to more clearly illustrate features of the microelectronic device structure 100 vertically underlying the first masking structure 116 and the isolation structures 110.

The base structure 102 may comprise any base material or construction upon which additional materials may be formed. The base structure 102 may comprise a semiconductive structure (e.g., a semiconductor substrate); a base semiconductive material on a supporting structure; a structure including one or more of different materials, structures, and regions; another base material; or another construction. In some embodiments, the base structure 102 is formed of and includes a semiconductive material. The base structure 102 may, for example, comprise a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The material(s) of the base structure 102 may be doped or may be undoped.

As shown in FIG. 1B, the base structure 102 may include conductively-doped regions 104 and channel regions 106. The conductively-doped regions 104 may include drain regions 104A and source regions 104B. The drain regions 104A, the source regions 104B, and the channel regions 106 may each be vertically positioned (e.g., in the Z-direction) proximate uppermost vertical boundaries of the base structure 102, and the channel regions 106 may be horizontally interposed (e.g., in the X-direction) between the drain regions 104A and the source regions 104B. Each drain region 104A may be horizontally separated from the source region 104B most horizontally proximate thereto (e.g., in the X-direction) by one of the channel regions 106. As depicted in FIG. 1B, in some embodiments, a single pair (e.g., only two) of the channel regions 106 horizontally intervenes between a single pair (e.g., only two) of the drain regions 104A, and a single (e.g., only one) source region 104B horizontally intervenes between the single pair of the channel regions 106. Such a configuration may be employed in embodiments wherein a single (e.g., only one) source region 104B is shared by two (2) horizontally-neighboring transistors. Within such a configuration, some horizontally-neighboring drain regions 104A may be free of any of the channel regions 106 and any of the source regions 104B horizontally interposed therebetween. In additional embodiments, a single pair (e.g., only two) of the channel regions 106 horizontally intervenes between a single pair (e.g., only two) of the drain regions 104A, and a single pair (e.g., only two) of the source regions 104B horizontally intervenes between the single pair of the channel regions 106. Such a configuration may be employed in embodiments wherein the source regions 104B are not shared by horizontally-neighboring transistors. Within such a configuration, some horizontally-neighboring drain regions 104A may be free of any of the channel regions 106 and any of the source regions 104B horizontally interposed therebetween, and some horizontally-neighboring source regions 104B may be free of any of the channel regions 106 and any of the source regions 104B horizontally interposed therebetween.

The conductively-doped regions 104 (e.g., the drain regions 104A, the source regions 104B) of the base structure 102 may be doped with any desired dopant(s). In some embodiments, the conductively-doped regions 104 are doped with at least one P-type dopant (e.g., one or more of boron, aluminum, and gallium). Thus, the conductively-doped regions 104 may exhibit deficiencies of valence electrons (commonly referred to as "holes"). In some such embodiments, one or more regions of the base structure 102 surrounding the conductively-doped regions 104, such as the channel regions 106, may be doped with at least one N-type dopant (e.g., one or more of phosphorus, arsenic, antimony, and bismuth). In additional embodiments, the conductively-doped regions 104 are doped with at least one N-type dopant (e.g., one or more of phosphorus, arsenic, antimony, and bismuth). Thus, the conductively-doped regions 104 may exhibit excesses of free electrons. In some such embodiments, one or more regions of the base structure 102 surrounding the conductively-doped regions 104, such as the channel regions 106, may be doped with at least one P-type dopant (e.g., one or more of boron, aluminum, and gallium).

With continued reference to FIG. 1B, shallow trench isolation (STI) structures 105 may be horizontally interposed between (e.g., in the X-direction) horizontally-neighboring drain regions 104A of the base structure 102. The STI structures 105 may vertically extend (e.g., in the Z-direction) from upper vertically boundaries of the base structure 102 to or below lower vertical boundaries of the drain regions 104A of the base structure 102. The STI structures 105 may be formed of and include at least one dielectric material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the STI structures 105 may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. Each of the STI structures 105 may individually include a substantially homogeneous distribution or a substantially heterogeneous distribution of the at least one dielectric material. In some embodiments, each of the STI structures 105 exhibits a substantially homogeneous distribution of dielectric material. In further embodiments, at least one of the STI structures 105 exhibits a substantially heterogeneous distribution of at least one dielectric material. One or more of the STI structures 105 may, for example, be formed of and include a stack (e.g., laminate) of at least two different dielectric materials. In some embodiments, STI structures 105 are formed of and include silicon dioxide ($SiO_2$).

Still referring to FIG. 1B, the gate structures 108 may vertically overlie (e.g., in the Z-direction) the channel regions 106 of the base structure 102. The gate structures 108 may be horizontally aligned (e.g., in the X-direction) with the channel regions 106. Each of the gate structures 108 may individually horizontally intervene (e.g., in the X-direction) between one of the drain regions 104A of the base structure 102 and one of the source regions 104B of the base structure 102 most horizontally proximate (e.g., in the X-direction) to the one of the drain regions 104A. In some embodiments, such as embodiments wherein a single (e.g., only one) source region 104B horizontally intervenes between a single pair (e.g., only two) of the channel regions 106, horizontal distances (e.g., in the X-direction) between some gate structures 108 horizontally-neighboring one another may be different (e.g., less than, greater than) horizontal distances (e.g., in the X-direction) between other gate structures 108 horizontally-neighboring one another. For example, as shown in FIG. 1B, a horizontal distance (e.g., in the X-direction) between two (2) of the gate structures 108 horizontally separated from one another by one (1) of the source regions 104B of the base structure 102 may be less than a horizontal distance (e.g., in the X-direction) between two (2) other of the gate structures 108 horizontally separated from one another by two (2) of the drain regions 104A of the base structure 102. In additional embodiments, horizontally-neighboring gate structures 108 of the microelectronic device structure 100 may all be horizontally separated (e.g., in the X-direction) from one another by substantially the same distance.

The gate structures 108 may be formed of and include at least one electrically conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. The gate structures 108 may include substantially homogeneous distributions of the electrically conductive material, or may include substantially heterogeneous distributions of the electrically conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. If the gate structures 108 exhibit substantially heterogeneous distributions of the electrically conductive material, amounts of the electrically conductive material may vary stepwise (e.g., change abruptly), or may vary continuously (e.g., change progressively, such as linearly, parabolically) throughout different portions of the gate structures 108. In some embodiments, the gate structures 108 each exhibit a substantially homogeneous distribution of electrically conductive material. In additional embodiments, one or more (e.g., each) of the gate structures 108 exhibits a substantially heterogeneous distribution of at least one electrically conductive material. One or more of the gate structures 108 may, for example, be formed of and include a stack of at least two different electrically conductive materials.

With continued reference to FIG. 1B, the isolation structures 110 may horizontally intervene (e.g., in the X-direction) between the gate structures 108, and may vertically overlie (e.g., in the Z-direction) the conductively-doped regions 104 (e.g., the drain regions 104A, the source regions 104B) of the base structure 102. The isolation structures 110 may horizontally alternate (e.g., in the X-direction) with the gate structures 108, and may be horizontally aligned (e.g., in the X-direction) with the conductively-doped regions 104 of the base structure 102. The isolation structures 110 may horizontally extend from and between horizontal boundaries of horizontally-neighboring gate structures 108, and may vertically extend from upper boundaries of the base structure 102 to lower boundaries of the first masking structure 116. Widths (e.g., in the X-direction) of the isolation structures 110 may correspond to (e.g., be the same as) the horizontal distances (e.g., in the X-direction) between horizontally-neighboring gate structures 108. Accordingly, in some embodiments, such as embodiments wherein a single (e.g., only one) source region 104B horizontally intervenes between a single pair (e.g., only two) of the channel regions 106, widths (e.g., in the X-direction) of some of the isolation structures 110 may be different (e.g., less than, greater than) widths (e.g., in the X-direction) of other of the isolation structures 110. For example, as shown in FIG. 1B, a width of one of the isolation structures 110 between two (2) of the gate structures 108 horizontally separated from one another by one (1) of the source regions 104B of the base structure 102 may be less than a width of another of the isolation structures 110 between two (2) other of the gate structures 108 horizontally separated from one another by two (2) of the drain regions 104A of the base structure 102. In additional embodiments, horizontally-neighboring isolation structures 110 of the microelectronic device structure 100 may all be horizontally separated (e.g., in the X-direction) from one another by substantially the same distance.

The isolation structures 110 may be formed of and include at least one dielectric material, such one or more of at least one dielectric oxide material (e.g., one or more of $SiO_x$, phosphosilicate glass, borosilicate glass, borophosphosilicate glass, fluorosilicate glass, an $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). Each of the isolation structures 110 may individually include a substantially homogeneous distribution or a substantially heterogeneous distribution of the at least one dielectric material. In some embodiments, each of the isolation structures 110 exhibits a substantially homogeneous distribution of dielectric material. In further embodiments, at least one of the isolation structures 110 exhibits a substantially heterogeneous distribution of at least one dielectric material. One or more of the isolation structures 110 may, for example, be formed of and include a stack (e.g., laminate) of at least two different dielectric materials. In some embodiments, each of the isolation structures 110 is formed of and includes Sift.

With continued reference to FIG. 1B, the microelectronic device structure 100 may further include gate dielectric structures 112 positioned vertically between (e.g., in the Z-direction) the gate structures 108 and the channel regions 106 of the base structure 102. The gate dielectric structures 112 may horizontally extend (e.g., in the X-direction) from and between horizontal boundaries of horizontally-neighboring gate structures 108. The gate dielectric structures 112 may vertically extend from lower vertical boundaries of the gate structures 108 to upper vertical boundaries of the channel regions 106 of the base structure 102. The gate dielectric structures 112 may be formed to exhibit any desirable height (e.g., vertical thickness in the Z-direction), such as a height less than or equal to about 150 Å, less than or equal to about 100 Å, less than or equal to about 75 Å, or less than or equal to about 50 Å. In some embodiments, each of the gate dielectric structures 112 is formed to have a height within a range of from about 20 Å to about 60 Å.

The gate dielectric structures 112 may be formed of and include at least one dielectric material, such as one or more of at least one oxide dielectric material (e.g., one or more of $SiO_x$, $AlO_x$, phosphosilicate glass, borosilicate glass, borophosphosilicate glass, fluorosilicate glass), at least one nitride dielectric material (e.g., $SiN_y$), at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride (Si- $O_xC_zN_y$)), and at least one high-K dielectric material (e.g., one or more of $HfO_x$ and $ZrO_x$). Each of the gate dielectric structures 112 may individually include a substantially homogeneous distribution or a substantially heterogeneous distribution of the at least one dielectric material. In some embodiments, each of the gate dielectric structures 112 exhibits a substantially homogeneous distribution of dielectric material. In further embodiments, at least one of the gate dielectric structures 112 exhibits a substantially heterogeneous distribution of at least one dielectric material. In some embodiments, the gate dielectric structures 112 are formed of and include $SiO_2$.

As shown in FIG. 1B, the gate structures 108, the gate dielectric structures 112, and the conductively-doped regions 104 (including the drain regions 104A and the source regions 104B) and channel regions 106 of the base structure 102 may form transistors 115 of the microelectronic device structure 100. Each of the transistors 115 may include one of the gate structures 108, one of the gate dielectric structures 112, one of the channel regions 106, one of the drain regions 104A, and one of the source regions 104B. Some transistors 115 horizontally-neighboring (e.g., in the X-direction) may share a single (e.g., only one) source region 104B of the base structure 102 with one another. For example, as depicted in FIG. 1B, the microelectronic device structure 100 may include transistor pairs 117 each including two (2) horizontally-neighboring transistors 115 sharing a single source region 104B of the base structure 102 with one another. In additional embodiments, the transistors 115 of the microelectronic device structure 100 may not share the source regions 104B of the base structure 102 with one another.

With continued reference to FIG. 1B, the microelectronic device structure 100 may further include dielectric cap structures 114 positioned vertically between (e.g., in the Z-direction) the gate structures 108 and the first masking structure 116. The dielectric cap structures 114 may horizontally extend (e.g., in the X-direction) from and between horizontal boundaries of horizontally-neighboring gate structures 108. The dielectric cap structures 114 may vertically extend from upper vertical boundaries of the gate structures 108 to lower vertical boundaries of the first masking structure 116. The dielectric cap structures 114 may be formed to exhibit any desirable height (e.g., vertical thickness in the Z-direction), such as a height less than or equal to about 150 Angstroms (Å), less than or equal to about 100 Å, less than or equal to about 75 Å, or less than or equal to about 50 Å. In some embodiments, each of the dielectric cap structures 114 is formed to have a height within a range of from about 50 Å to about 100 Å. As shown in FIG. 1A, upper boundaries of the dielectric cap structures 114 may be substantially coplanar with upper boundaries of the isolation structures 110. In further embodiments, the upper boundaries of the dielectric cap structures 114 may be vertically offset (e.g., vertically underlie, vertically overlie) from upper boundaries of the isolation structures 110.

The dielectric cap structures 114 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. The isolation structures 110 may be selectively etchable relative to the dielectric cap structures 114. As used herein, a material is "selectively etchable" relative to another material if the material exhibits an etch rate that is at least about three times (3×) greater than the etch rate of another material, such as five times (5×) greater, about ten times (10×) greater, about twenty times (20×) greater, or about forty times (40×) greater. In some embodiments, the dielectric cap structures 114 are formed of and include silicon nitride ($Si_3N_4$).

Still referring to FIG. 1B, the microelectronic device structure 100 may further include sidewall spacer structures 113 positioned horizontally between (e.g., in the X-direction) the gate structures 108 and the isolation structures 110. As shown in FIG. 1B, the sidewall spacer structures 113 may be formed on sidewalls of the gate structures 108, the gate dielectric structures 112, and the dielectric cap structures 114. The sidewall spacer structures 113 may horizontally extend (e.g., in the X-direction) from the sidewalls of the gate structures 108, the gate dielectric structures 112, and the dielectric cap structures 114 to the isolation structures 110. In addition, the sidewall spacer structures 113 may vertically extend (e.g., in the Z-direction) from or proximate upper vertical boundaries of the dielectric cap structures 114 to or proximate lower vertical boundaries of the gate dielectric structures 112.

The sidewall spacer structures 113 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. The isolation structures 110 may be selectively etchable relative to the sidewall spacer structures 113. In some embodiments, the sidewall spacer structures 113 are formed of and include $Si_3N_4$.

With continued reference to FIG. 1B, the first masking structure 116 may be provided over the gate structures 108 and the isolation structures 110. As shown in FIG. 1B, the first masking structure 116 may be formed on upper surfaces of the isolation structures 110 and the dielectric cap structures 114. The first masking structure 116 may be formed on or over the gate structures 108 and the isolation structures 110 to any desired height (e.g., vertical thickness in the Z-direction). The height of the first masking structure 116 may at least partially depend on the height and material composition of the isolation structures 110. In some embodiments, the first masking structure 116 exhibits a thickness within a range of from about 100 Å to about 5000 Å (e.g., from about 100 Å to about 3000 Å, or from about 100 Å to about 1000 Å).

The first masking structure 116 may be formed of and include at least one material suitable for use as an etch mask to pattern portions of the isolation structures 110 following the patterning of the first masking structure 116, as described in further detail below. The isolation structures 110 may be selectively etchable relative to the first masking structure 116. By way of non-limiting example, the first masking structure 116 may be formed of and include one or more of at least one dielectric material (e.g., a dielectric oxide material, such as one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$; a dielectric nitride material, such as $SiN_y$; a dielectric oxynitride material, such as $SiO_xN_y$; a dielectric carboxynitride material, such as $SiO_xC_zN_y$; amorphous carbon), at least one metal-doped carbon material (e.g., boron-doped carbon, tungsten-doped carbon, nickel-doped carbon), at least one semiconductive material (e.g., polysilicon), at least one conductive material (e.g., a metal, such as one or more of aluminum and tungsten), and at least one antireflective material. In some embodiments, the first masking structure 116 comprises amorphous carbon. The first masking structure 116 may be substantially homogeneous (e.g., may be formed of and include only one material), or may be heterogeneous (e.g., may be formed of and include more than one material, such as a stack including at least two different materials). In some embodiments, the first masking structure 116 comprises a stack of at least two different materials (e.g., two of more different materials selected from dielectric materials, metal-doped carbon materials, semiconductive materials, conductive materials, and antireflective materials).

With continued reference to FIG. 1B, the second masking structure 118 may be formed on or over the first masking structure 116. In some embodiments, the second masking structure 118 is formed on an upper surface of the first masking structure 116. The second masking structure 118 may include openings 120 (e.g., apertures) therein. The openings 120 may vertically extend (e.g., in the Z-direction) completely through the second masking structure 118. The openings 120 may expose predetermined areas of the first masking structure 116 underlying the second masking structure 118. The geometric configurations (e.g., dimensions, shapes) and positions of the openings 120 may be selected to facilitate desirable geometric configurations (e.g., dimensions, shapes) and positions for structures (e.g., spacer structures, liner structure) to subsequently be formed within the openings 120, as described in further detail below. As shown in FIG. 1B, linear portions 121 of the second masking structure 118 may intervene between (e.g., in the X-direction) the horizontally-neighboring openings 120.

The second masking structure 118 may be formed of and include at least one material able to be selectively removed relative to the first masking structure 116 and one or more structures (e.g., spacer structures, liner structures) to be subsequently formed within the openings 120 in the second masking structure 118, as described in further detail below. Subsequent selective removal of the material of the second masking structure 118 may, for example, facilitate pitch density multiplication (e.g., pitch density doubling) operations using the subsequently-formed structures. By way of non-limiting example, the second masking structure 118 may be formed of and include a conventional resist material, such as a conventional photoresist material (e.g., a conventional positive tone photoresist, a conventional negative tone photoresist) or a conventional thermoresist material. If the second masking structure 118 comprises a photoresist material, exposing (e.g., if the photoresist material comprises a positive tone photoresist) or not exposing (e.g., if the photoresist material comprises a negative tone photoresist) the photoresist material to at least a minimum threshold dosage of electromagnetic radiation may cause the photoresist material to become at least partially soluble in a developer. If the second masking structure 118 comprises a thermoresist material, exposing or not exposing thermoresist material to at least a minimum threshold temperature may cause the thermoresist material to become at least partially soluble in a developer. Suitable resist materials (e.g., positive tone photoresist materials, negative tone photoresist materials, thermoresist materials) are known in the art, and are, therefore, not described in detail herein. In some embodiments, the second masking structure 118 comprises a conventional photoresist material. The photoresist material of the second masking structure 118 may, for example, be compatible with 13.7 nm, 157 nm, 193 nm, 248 nm, or 365 nm wavelength systems; with 193 nm wavelength immersion systems; and/or with electron beam lithographic systems.

Referring collectively to FIGS. 1A and 1B, the openings 120 within the second masking structure 118 may be formed to exhibit horizontal positions (e.g., in the X-direction and the Y-direction), horizontal cross-sectional shapes, and horizontal dimensions (e.g., in the X-direction and the Y-direction) facilitating desired horizontal positions, horizontal cross-sectional shapes, and horizontal dimensions for structures (e.g., spacer structures, liner structures) to be subsequently formed using the second masking structure 118. Each of the openings 120 within the second masking structure 118 may at least partially horizontally overlap (e.g., in the X-direction and the Y-direction) at least one of the transistors 115 (FIG. 1B). In some embodiments, each of the openings 120 is substantially horizontally aligned with at least one of the transistors 115 (FIG. 1B). For example, each of the openings 120 may individually be substantially horizontally aligned with one (1) of the transistor pairs 117 (FIG. 1B) of the microelectronic device structure 100. As shown in FIG. 1A, the openings 120 may each exhibit a rectangular horizontal cross-sectional shape including a first length $L_1$ (e.g., horizontal dimension in the Y-direction) and a first width $W_1$ (e.g., horizontal dimension in the X-direction). The first length $L_1$ of each of the openings 120 may be substantially the same as (e.g., substantially equal to) or may be different than (e.g., less than or greater than) a length of the gate structures 108. The first width $W_1$ of each of the openings 120 may horizontally extend (e.g., in the X-direction) between and past horizontal boundaries (e.g., in the X-direction) of the at least one transistor 115 (FIG. 1B) that the opening 120 horizontally overlaps. For example, as shown in FIG. 1B, in some embodiments, each of the openings 120 individually exhibits a first width $W_1$ horizontally extending (e.g., in the X-direction) between and past horizontal boundaries (e.g., in the X-direction) of the one (1) of the transistor pairs 117 of the microelectronic device structure 100. The first width $W_1$ of each of the openings 120 may encompass an overall width (e.g., in the X-direction) of the transistor pair 117 horizontally aligned therewith (e.g., from and between outermost horizontal boundaries of the drain regions 104A of the transistor pair 117), as well as at least a portion (e.g., substantially all) of each distance $D_1$ (e.g., in the X-direction) between the transistor pair 117 and each additional transistor pair 117 horizontally-neighboring (e.g., in the X-direction) the transistor pair 117.

The openings 120 within the second masking structure 118 may exhibit substantially the same geometric configuration (e.g., substantially the same dimensions, substantially the same shape) as one another, and horizontally-neighboring openings 120 within the second masking structure 118 may be horizontally separated from one another (e.g., by the linear portions 121 of the second masking structure 118) by substantially the same distance. Accordingly, a pitch between horizontal centerlines (e.g., in the X-direction) of horizontally-neighboring openings 120 may be substantially uniform throughout the second masking structure 118. In additional embodiments, one or more of the openings 120 within the second masking structure 118 may exhibit one or more of a different geometric configuration (e.g., different dimensions, a different shape) and different spacing than one or more other of the openings 120 within the second masking structure 118.

The base structure 102 (including the conductively-doped regions 104 and the channel regions 106 thereof), the gate structures 108, the isolation structures 110, the gate dielectric structures 112, the dielectric cap structures 114, the first masking structure 116, and the second masking structure 118 (including the openings 120 therein) of the microelectronic device structure 100 may be formed using conventional processes (e.g., conventional deposition processes, such as one or more of in situ growth, spin-on coating, blanket coating, CVD, ALD, and PVD; conventional doping processes; conventional patterning and material removal processes, such as conventional photolithographic exposure processes, conventional development processes, conventional etching processes) and conventional processing equipment, which are not described in detail herein.

Figure 2A:
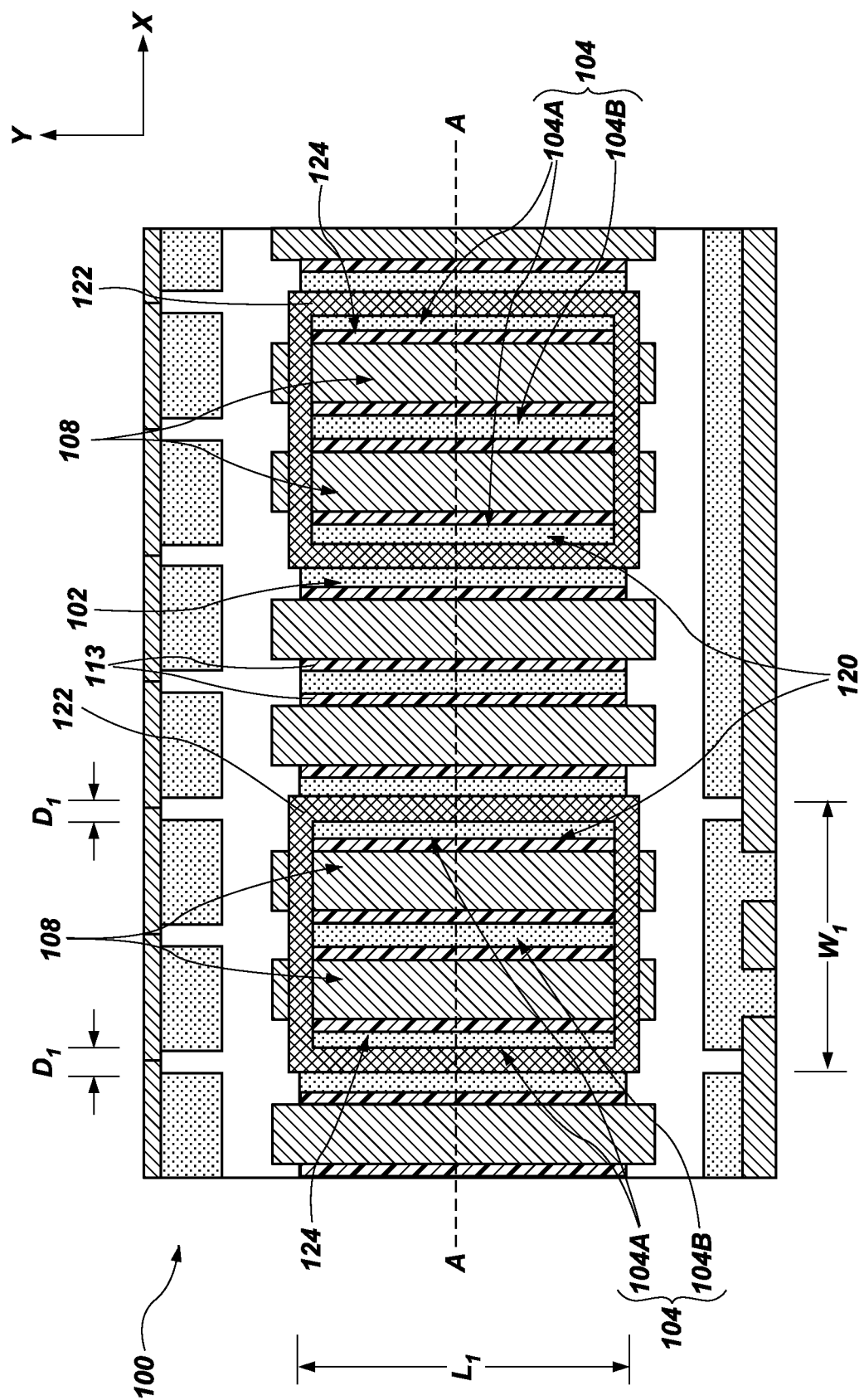
Figure 2B:
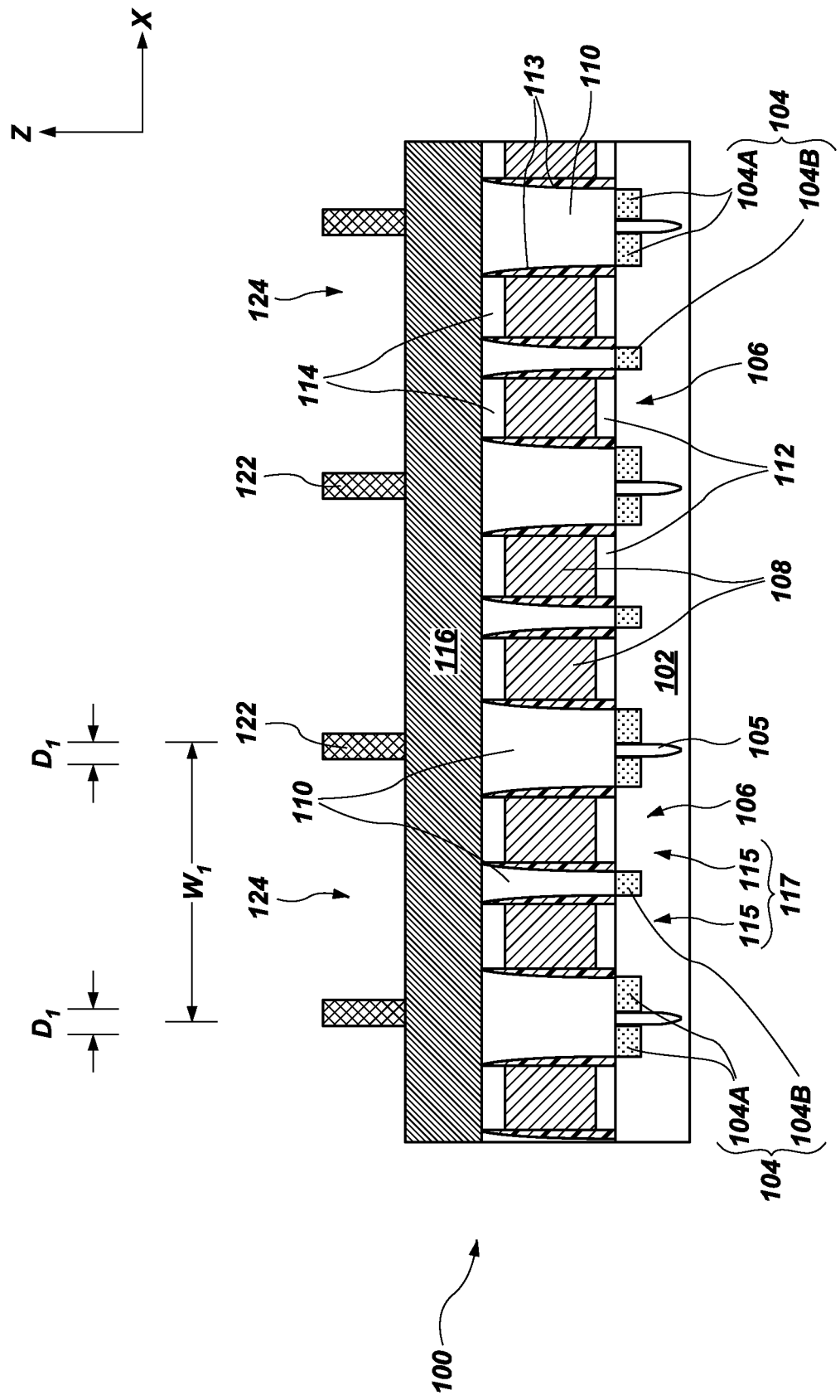

Referring next to FIG. 2A, spacer structures 122 may be formed on (e.g., directly adjacent) side surfaces of the second masking structure 118 (FIGS. 1A and 1B) defining the openings 120 (FIGS. 1A and 1B), and then the second masking structure 118 may be selectively removed relative to the spacer structures 122. The spacer structures 122 may partially (e.g., less than completely) fill the openings 120 (FIGS. 1A and 1B) within the second masking structure 118 to form additional openings 124 horizontally bounded (e.g., in the X-direction and the Y-direction) by inner side surfaces of the spacer structures 122. FIG. 2B is a simplified partial cross-sectional view of the microelectronic device structure 100 (about the line A-A) at the processing stage shown in FIG. 2A. For clarity and ease of understanding of the drawings and related description, not all features depicted in one of FIGS. 2A and 2B are depicted in the other of FIGS. 2A and 2B.

The spacer structures 122 may be formed of and include at least one material having a different etch selectivity than the second masking structure 118. The second masking structure 118 may selectively etchable relative to the spacer structures 122. For example, the spacer structures 122 may be formed of and include one or more at least one dielectric material (e.g., one or more of at least one dielectric oxide material, such as one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$; at least one dielectric nitride material, such as $SiN_y$; at least one dielectric oxynitride material, such as $SiO_xN_y$; and at least one dielectric carboxynitride material, such as $SiO_xC_zN_y$), at least one semiconductive material (e.g., polysilicon), and at least one conductive material (e.g., at least one metal). In some embodiments, the spacer structures 122 are formed of and include a dielectric oxide material. The spacer structures 122 may be substantially homogeneous (e.g., may be formed of and include only one material), or may be heterogeneous (e.g., may be formed of and include more than one material, such as a stack including at least two different materials). In some embodiments, the spacer structures 122 are each substantially homogeneous.

As shown in FIG. 2A, the spacer structures 122 may each individually be formed to exhibit a rectangular ring horizontal cross-sectional shape. Outermost horizontal boundaries of each of the spacer structures 122 may exhibit dimensions (e.g., in the X-direction and the Y-direction) corresponding to the horizontal dimensions of the opening 120 (FIG. 1A) within which the spacer structure 122 is formed. For example, each of the spacer structures 122 may exhibit the first length $L_1$ (e.g., horizontal dimension in the Y-direction) and the first width $W_1$ (e.g., horizontal dimension in the X-direction). In addition, each of the spacer structures 122 may be formed to exhibit a desirable horizontal thickness (e.g., linear horizontal dimension between an inner horizontal boundary of the spacer structure 122 and an outer horizontal boundary of the spacer structure 122 horizontally-neighboring and extending parallel to the inner horizontal boundary of the spacer structure 122). The horizontal thicknesses of the spacer structures 122 may be selected at least partially based on the horizontal distances between horizontally-neighboring conductively-doped regions 104 (e.g., horizontally-neighboring drain regions 104A) of horizontally-neighboring transistors 115 (FIG. 2B) of the microelectronic device structure 100. For example, as depicted in FIG. 2A, the horizontal thickness of each spacer structure 122 may be greater than or equal to the distance $D_1$ between horizontally-neighboring transistor pairs 117 of the microelectronic device structure 100. In some embodiments, the horizontal thickness of each spacer structure 122 is substantially the same as (e.g., is substantially equal to) the distance $D_1$ between horizontally-neighboring transistor pairs 117 of the microelectronic device structure 100. In additional embodiments, the horizontal thickness of each spacer structure 122 is greater than the distance $D_1$ between horizontally-neighboring transistor pairs 117 of the microelectronic device structure 100.

The spacer structures 122 may be formed using conventional processes (e.g., conventional pitch density multiplication processes) and conventional processing equipment, which are not described in detail herein. By way of non-limiting example, a spacer material may be formed on exposed surfaces inside and outside of the openings 120 (FIGS. 1A and 1B) within the second masking structure 118 (FIGS. 1A and 1B) (e.g., exposed surfaces of the second masking structure 118 and the first masking structure 116), and then portions of the spacer material outside of the openings 120 and on surfaces (e.g., upper surfaces of the first masking structure 116) defining floors (e.g., lower vertical boundaries) of the openings 120 may be removed to form the spacer structures 122 and the additional openings 124. The spacer material may be formed using one or more conventional conformal deposition processes, such as one or more of a conventional ALD process and a conventional conformal CVD process. Portions of the spacer material may be removed by one or more of conventional etching processes, such as one or more of anisotropic dry etching (e.g., one or more of reactive ion etching (RIE), deep RIE, plasma etching, reactive ion beam etching, and chemically assisted ion beam etching) and anisotropic wet etching (e.g., one or more of hydrofluoric acid (HF) etching, buffered HF etching, and buffered oxide etching (BOE)). Following the formation of the spacer structures 122, the second masking structure 118 may be selectively removed using one or more additional conventional material removal processes (e.g., a conventional development process).

Figure 3A:
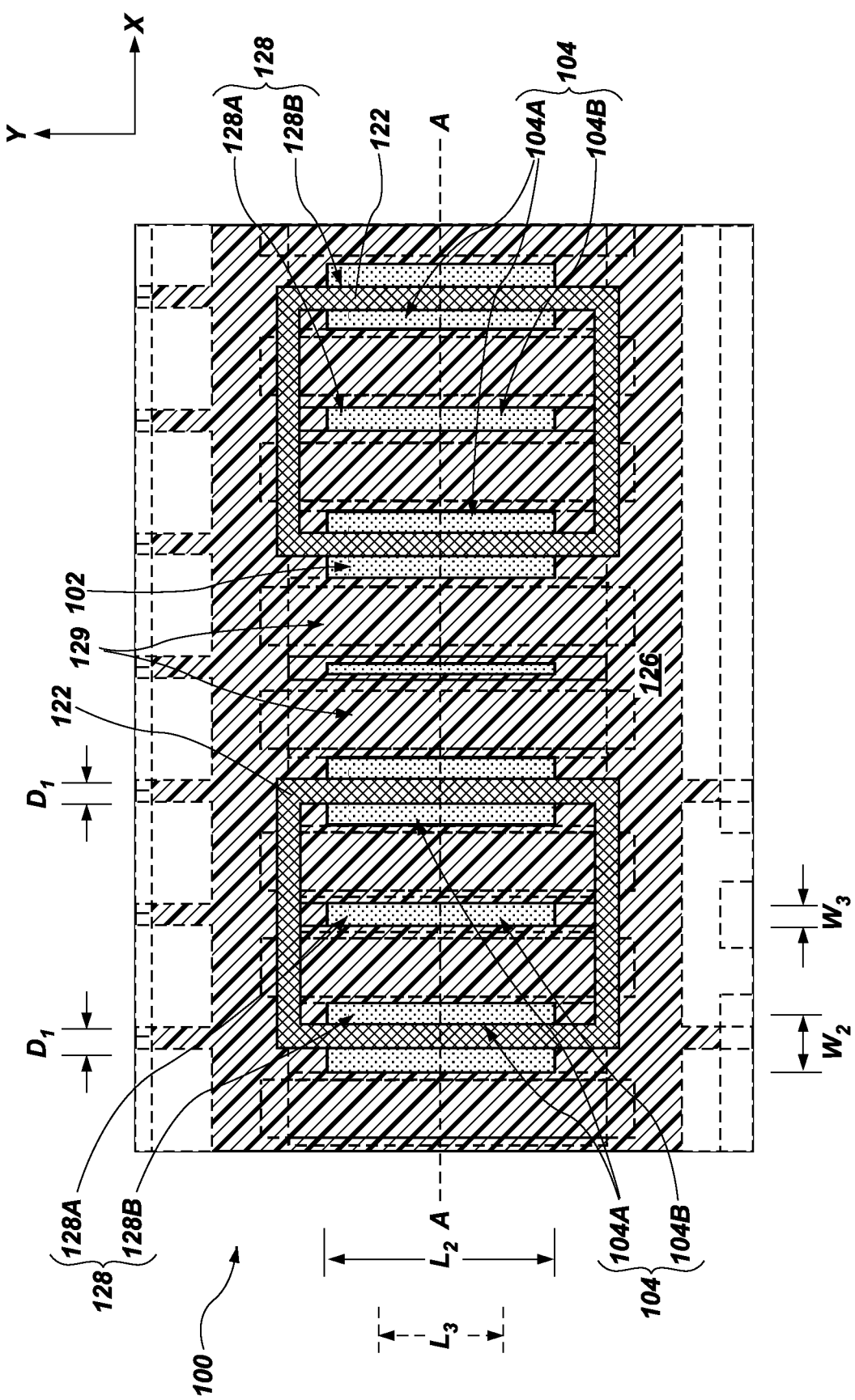
Figure 3B:
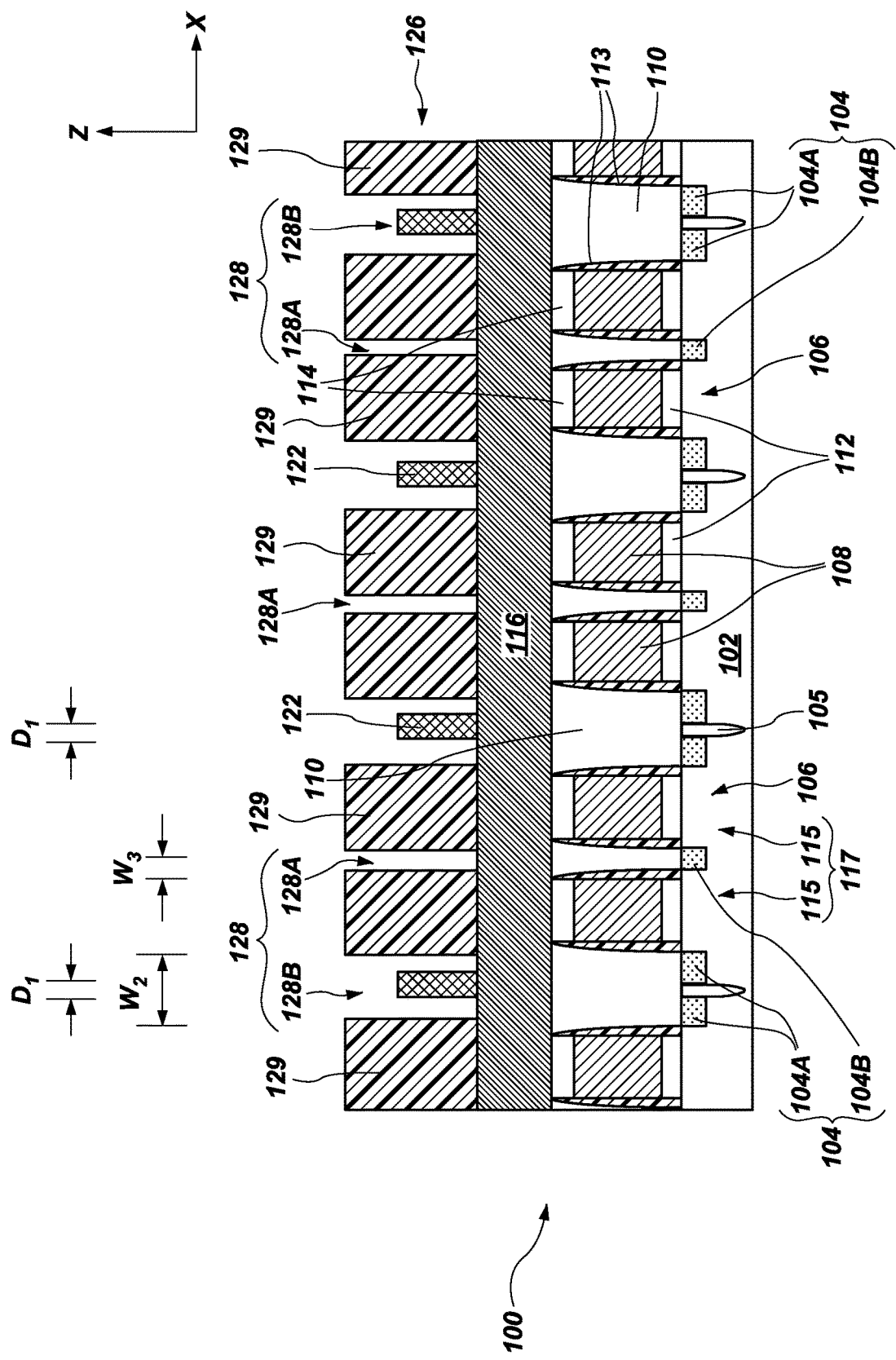

Referring next to FIG. 3A, a third masking structure 126 may be formed on or over exposed surfaces of the first masking structure 116 (FIG. 2B) and the spacer structures 122. The third masking structure 126 may serve as a mask to facilitate selective removal of portions of the first masking structure 116 not covered by one or more of the third masking structure 126 and the spacer structures 122, as described in further detail below. As shown in FIG. 3A, the third masking structure 126 may include trenches 128 (e.g., openings, apertures) therein. The trenches 128 may vertically extend completely through the third masking structure 126 to expose portions of the first masking structure 116 and the spacer structures 122. The geometric configurations (e.g., dimensions, shapes) and positions of the trenches 128 may be selected at least partially based on the geometric configurations (e.g., dimensions, shapes) and positions of the spacer structures 122 to facilitate the formation of a desirable pattern to subsequently be transferred into the first masking structure 116, as described in further detail below. Linear portions 129 of the third masking structure 126 may intervene between (e.g., in the X-direction) the horizontally-neighboring trenches 128. FIG. 3B is a simplified partial cross-sectional view of the microelectronic device structure 100 (about the line A-A) at the processing stage shown in FIG. 3A. For clarity and ease of understanding of the drawings and related description, not all features depicted in one of FIGS. 3A and 3B are depicted in the other of FIGS. 3A and 3B.

Referring to FIG. 3B, the third masking structure 126 may be formed of and include at least one material that is able to facilitate the transfer of a pattern defined by the combination of the spacer structures 122 and the third masking structure 126 into the first masking structure 116, as described in further detail below. By way of non-limiting example, the third masking structure 126 may be formed of and include a conventional resist material, such as a conventional photoresist material (e.g., a conventional positive tone photoresist, a conventional negative tone photoresist) or a conventional thermoresist material. Suitable resist materials (e.g., positive tone photoresist materials, negative tone photoresist materials, thermoresist material) are known in the art, and are, therefore, not described in detail herein. In some embodiments, the third masking structure 126 may, for example, be compatible with 13.7 nm, 157 nm, 193 nm, 248 nm, or 365 nm wavelength systems; with 193 nm wavelength immersion systems; and/or with electron beam lithographic systems.

Referring collectively to FIGS. 3A and 3B, the trenches 128 within the third masking structure 126 may include first trenches 128A and second trenches 128B. The first trenches 128A may horizontally overlap (e.g., in the X-direction and the Y-direction) the source regions 104B of the base structure 102. In some embodiments, the first trenches 128A are substantially horizontally aligned with and partially horizontally extend over the source regions 104B of the base structure 102. The first trenches 128A may be substantially horizontally centered about the source regions 104B of the base structure 102 in the X-direction. The second trenches 128B may horizontally overlap (e.g., in the X-direction and the Y-direction) the drain regions 104A of the base structure 102 and portions of the spacer structures 122 horizontally-neighboring the drain regions 104A (e.g., portions of the spacer structures 122 extending in the Y-direction and intervening between drain regions 104A horizontally-neighboring one another in the X-direction). In some embodiments, the second trenches 128B are substantially horizontally aligned with the portions of the spacer structures 122 and partially horizontally extend over drain regions 104A of the base structure 102 horizontally neighboring the portions of the spacer structures 122. The second trenches 128B may be substantially horizontally centered about the portions of the spacer structures 122 in the X-direction.

As shown in FIG. 3A, the trenches 128 (including the first trenches 128A and the second trenches 128B) within the third masking structure 126 may each exhibit a rectangular horizontal cross-sectional shape. The first trenches 128A may each individually exhibit a second width $W_2$ (e.g., horizontal dimension in the X-direction), and the second trenches 128B may each individually exhibit a third width $W_3$ larger than the second width $W_2$. In some embodiments, the second width $W_2$ of each of the first trenches 128A is less than a width of the source region 104B of the base structure 102 that the first trench 128A horizontally overlaps; and the third width $W_3$ of each of the second trenches 128B is less than combined widths of the portion of the spacer structures 122 and the drain regions 104A of the base structure 102 that the second trench 128B horizontally overlaps. In addition, as shown in FIG. 3A, the first trenches 128A and the second trenches 128B may each individually exhibit a second length $L_2$ (e.g., horizontal dimension in the Y-direction). The second length $L_2$ of each of the first trenches 128A and the second trenches 128B may be less than or equal to the lengths of the conductively-doped regions 104 of the base structure 102. In some embodiments, the first trenches 128A and the second trenches 128B are all formed to exhibit the second length $L_2$ (e.g., the trenches 128 are all formed to be of substantially uniform length relative to one another). In additional embodiments, a length of one or more (e.g., each) of the first trenches 128A is different than (e.g., less than, greater than) another length (e.g., the second length $L_2$) of one or more (e.g., each) of the second trenches 128B (e.g., the trenches 128 are formed to be of variable length relative to one another). As a non-limiting example, each of the first trenches 128A may, optionally, be formed to exhibit a third length $L_3$ less than the second length $L_2$ exhibited by each of the second trenches 128B. As another non-limiting example, each of the first trenches 128A may, optionally, be formed to exhibit the third length $L_3$ less than the second length $L_2$ that exhibited by each of the second trenches 128B.

The third masking structure 126 may be formed using conventional processes (e.g., conventional material deposition processes, conventional photolithography processes, conventional material removal processes) and conventional processing equipment, which are not described in detail herein. By way of non-limiting example, a resist material (e.g., a photoresist material) may be formed (e.g., deposited) on or over the spacer structures 122 and the first masking structure 116, and then the resist material may be processed (e.g., photolithographically processed, such as photoexposed and developed) to remove portions thereof and form the third masking structure 126 including the trenches 128 therein.

Figure 4A:
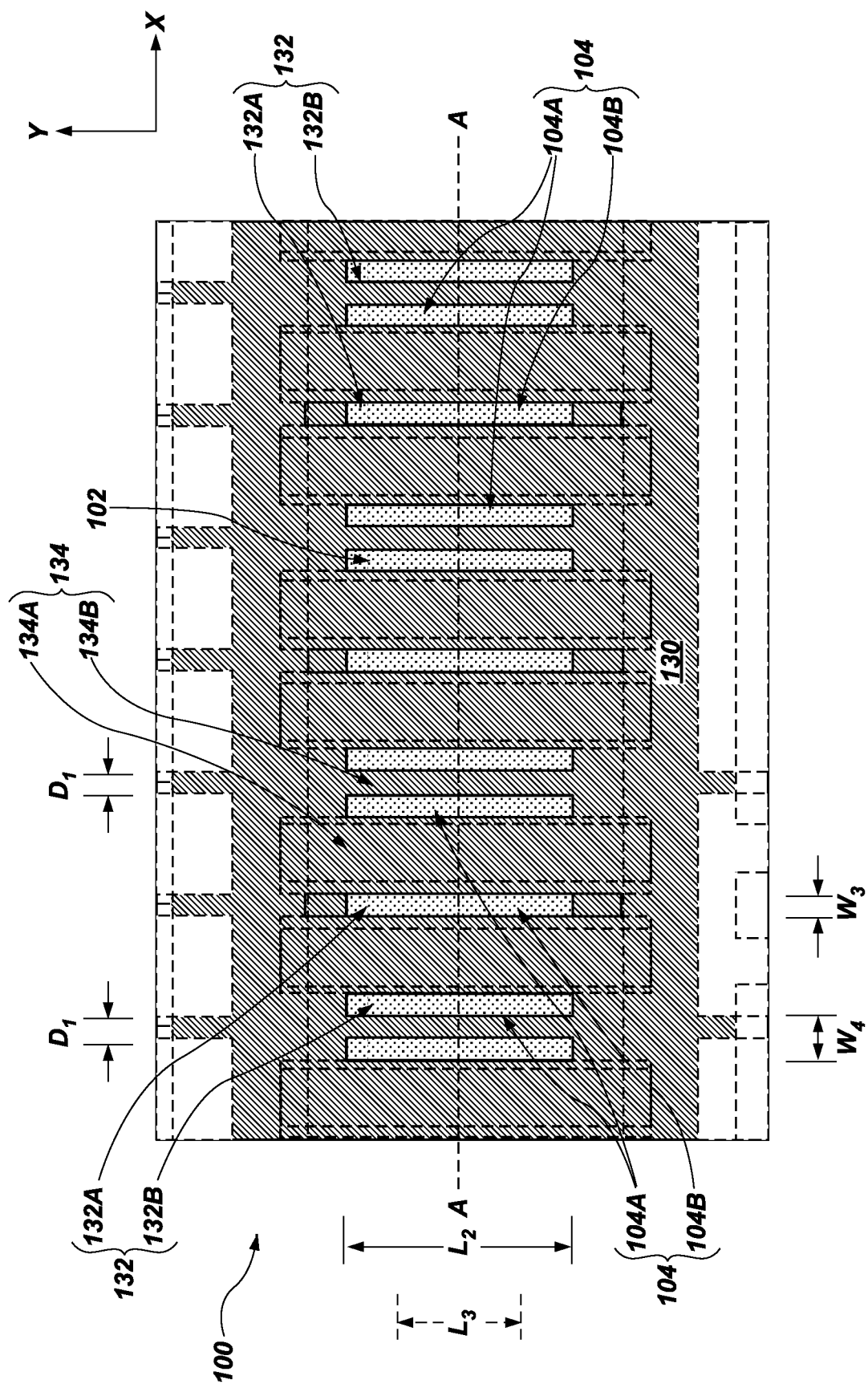
Figure 4B:
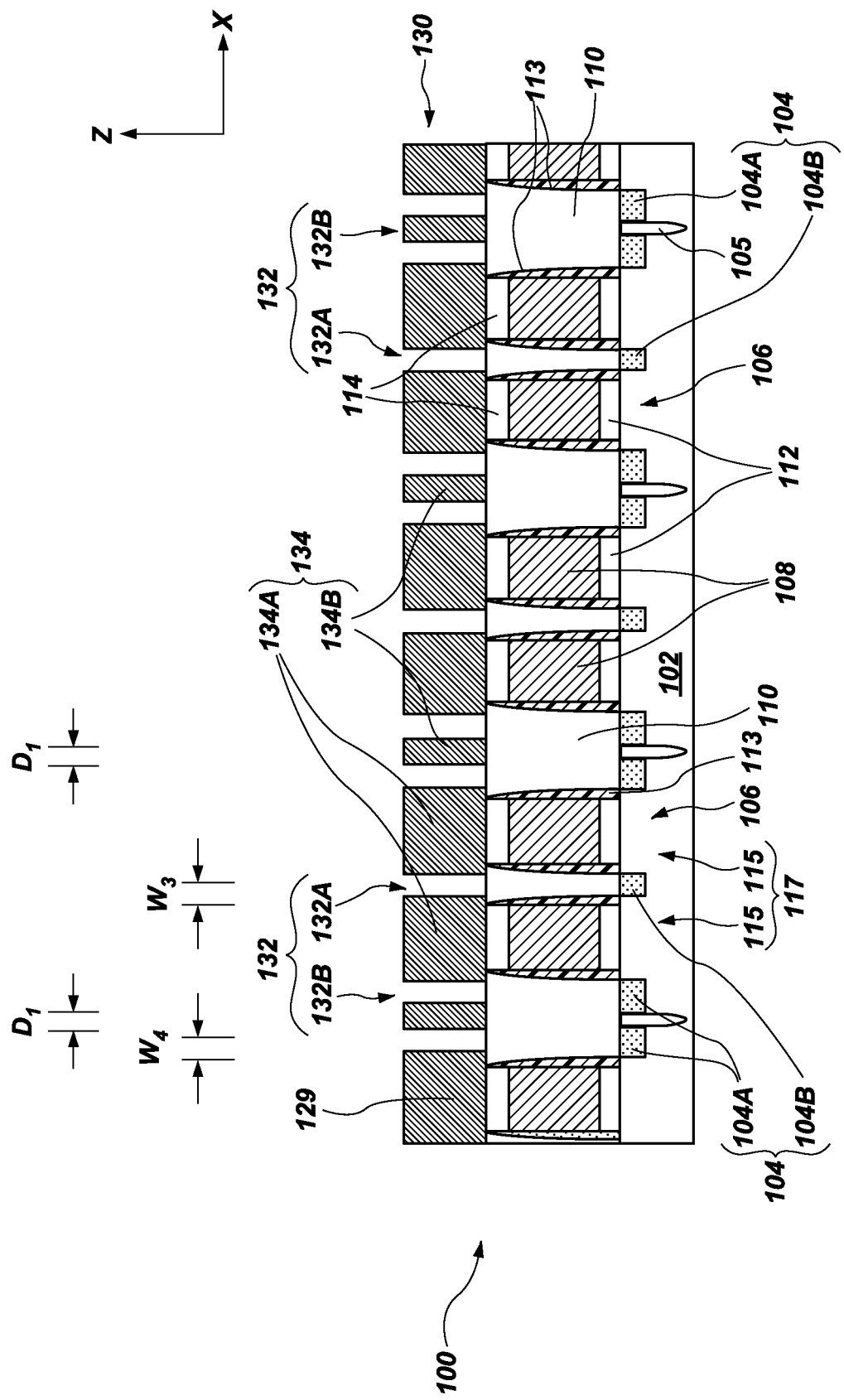

Referring next to FIG. 4A, portions of the first masking structure 116 (FIG. 3B) not covered by one or more of the spacer structures 122 and the third masking structure 126 may be removed to form a patterned first masking structure 130. The patterned first masking structure 130 may include additional trenches 132 therein. The additional trenches 132 may vertically extend completely through the patterned first masking structure 130 to expose portions of the isolation structures 110 (FIG. 3B). The additional trenches 132 within the patterned first masking structure 130 may be horizontally separated from one another (e.g., in the X-direction) by linear portions 134 of the patterned first masking structure 130. The patterned first masking structure 130 serve as a mask (e.g., a hard mask) to facilitate selective removal of portions of the isolation structures 110 (FIG. 3B) not covered by the patterned first masking structure 130, as described in further detail below. FIG. 4B is a simplified partial cross-sectional view of the microelectronic device structure 100 (about the line A-A) at the processing stage shown in FIG. 4A. For clarity and ease of understanding of the drawings and related description, not all features depicted in one of FIGS. 4A and 4B are depicted in the other of FIGS. 4A and 4B.

As shown in FIGS. 4A and 4B, the additional trenches 132 within the patterned first masking structure 130 may include first additional trenches 132A and second additional trenches 132B. The first additional trenches 132A may horizontally overlap the source regions 104B of the base structure 102, and the second additional trenches 132B may horizontally overlap the drain regions 104A of the base structure 102. In some embodiments, the first additional trenches 132A are each individually confined within horizontal boundaries (e.g., in the X-direction and the Y-direction) of one of the source regions 104B of the base structure 102, and the second additional trenches 132B are each individually confined within horizontal boundaries (e.g., in the X-direction and the Y-direction) of one of the drain regions 104A of the base structures. The first additional trenches 132A may be substantially horizontally aligned with and may partially horizontally extend over the source regions 104B of the base structure 102, and the second additional trenches 132B may be substantially horizontally aligned with and may partially horizontally extend over the drain regions 104A of the base structure 102. In some embodiments, each of the first additional trenches 132A is individually substantially horizontally centered about one of the source regions 104B of the base structure 102 in the X-direction, and each of the second additional trenches 132B is individually substantially horizontally centered about one of the drain regions 104A of the base structure 102 in the X-direction.

As also shown in FIGS. 4A and 4B, the linear portions 134 of the patterned first masking structure 130 horizontally intervening between the additional trenches 132 may include first linear portions 134A and second linear portions 134B. The first linear portions 134A may horizontally overlap the gate structure 108 and portions one or more of the sidewall spacer structures 113 (FIG. 4B) and the isolation structures 110 (FIG. 4B) horizontally proximate to the gate structure 108. The second linear portions 134B may horizontally overlap regions of the base structure 102 horizontally interposed between (e.g., in the X-direction) horizontally-neighboring drain regions 104A of the base structure 102. Each of the first additional trenches 132A may individually be substantially horizontally aligned with one of the gate structures 108 in the X-direction, and may horizontally extend in the X-direction completely over the gate structure 108 and at least over portions of the sidewall spacer structures 113 (and, optionally, the isolation structures 110) horizontally neighboring the gate structure 108. Each of the second additional trenches 132B may individually be substantially horizontally aligned with and may partially horizontally extend over one of the isolation structures 110 in the X-direction. In some embodiments, each of the first linear portions 134A of the patterned first masking structure 130 is individually substantially horizontally centered about one of gate structures 108 in the X-direction, and each of the second linear portions 134B of the patterned first masking structure 130 is individually substantially horizontally centered about one of the isolation structures 110 in the X-direction.

As shown in FIG. 4A, the additional trenches 132 (including the first additional trenches 132A and the second additional trenches 132B) within the patterned first masking structure 130 and the linear portions 134 (including the first linear portions 134A and the second linear portions 134B) of the patterned first masking structure 130 each individually exhibit a rectangular horizontal cross-sectional shape. The first additional trenches 132A may each individually exhibit a third width $W_3$ (e.g., horizontal dimension in the X-direction) and the second additional trenches 132B may each individually exhibit a fourth width $W_4$ (e.g., horizontal dimension in the X-direction). The third width $W_3$ may be substantially the same as (e.g., substantially equal to) the fourth width $W_4$, or the third width $W_3$ may be different than (e.g., less than, greater than) the fourth width $W_4$. In some embodiments, the third width $W_3$ is substantially the same as the fourth width $W_4$. The third width $W_3$ of each of the first additional trenches 132A may be less than a width of each individual drain region 104A of the base structure 102, and the fourth width $W_4$ of each of the second additional trenches 132B may be less than a width of each individual source region 104B of the base structure 102. In addition, as shown in FIG. 4A, each of the additional trenches 132 (e.g., each of the first additional trenches 132A and each of the second additional trenches 132B) may individually exhibit a length (e.g., a horizontal dimension in the Y-direction) corresponding (e.g., substantially the same as, equal to) a length of the trench 128 (e.g., the first trench 128A or the second trench 128B) (FIGS. 3A and 3B) in the third masking structure 126 (FIGS. 3A and 3B) used to form the additional trench 132. As a non-limiting example, if each of the trenches 128 (FIGS. 3A and 3B) in the third masking structure 126 (FIGS. 3A and 3B) is formed to exhibit the second length $L_2$, each of the additional trenches 132 in the patterned first masking structure 130 may also be formed to exhibit the second length $L_2$. As another non-limiting example, if the first trenches 128A (FIGS. 3A and 3B) in the third masking structure 126 are each formed to exhibit the third length $L_3$ and the second trenches 128B (FIGS. 3A and 3B) in the third masking structure 126 are each formed to exhibit the second length $L_2$, the first additional trenches 132A in the patterned first masking structure 130 may each be formed to exhibit the third length $L_3$ and the second additional trenches 132B in the patterned first masking structure 130 may each be formed to exhibit the second length $L_2$. As a further non-limiting example, if the first trenches 128A in the third masking structure 126 are each formed to exhibit the second length $L_2$ and the second trenches 128B in the third masking structure 126 are each formed to exhibit the third length $L_3$, the first additional trenches 132A in the patterned first masking structure 130 may each be formed to exhibit the second length $L_2$ and the second additional trenches 132B in the patterned first masking structure 130 may each be formed to exhibit the third length $L_3$.

The patterned first masking structure 130 may be formed using conventional processes (e.g., conventional material removal processes) and conventional processing equipment, which are not described in detail herein. By way of non-limiting example, to form the patterned first masking structure 130, the spacer structures 122 (FIGS. 3A and 3B) and the third masking structure 126 (FIGS. 3A and 3B) may be used as masks for at least one etching process (e.g., an anisotropic etching process, such as an reactive ion etching process) to substantially remove unmasked portions of the first masking structure 116 (FIG. 3B) thereunder (e.g., portions of the first masking structure 116 not covered by material of one or more of the spacer structures 122 and the third masking structure 126, such as portions of the first masking structure 116 within horizontal boundaries of the trenches 128 (FIGS. 3A and 3B) within the third masking structure 126 not covered by portions of the spacer structures 122). The unmasked portions of the first masking structure 116 (FIG. 3B) may be substantially (e.g., completely) removed, while substantially maintaining the masked portions (e.g., portions covered by the material of one or more of the spacer structures 122 and the third masking structure 126) of the third masking structure 126. Thereafter, remaining portions (if any) of the spacer structures 122 and the third masking structure 126 may be selectively removed.

Figure 5A:
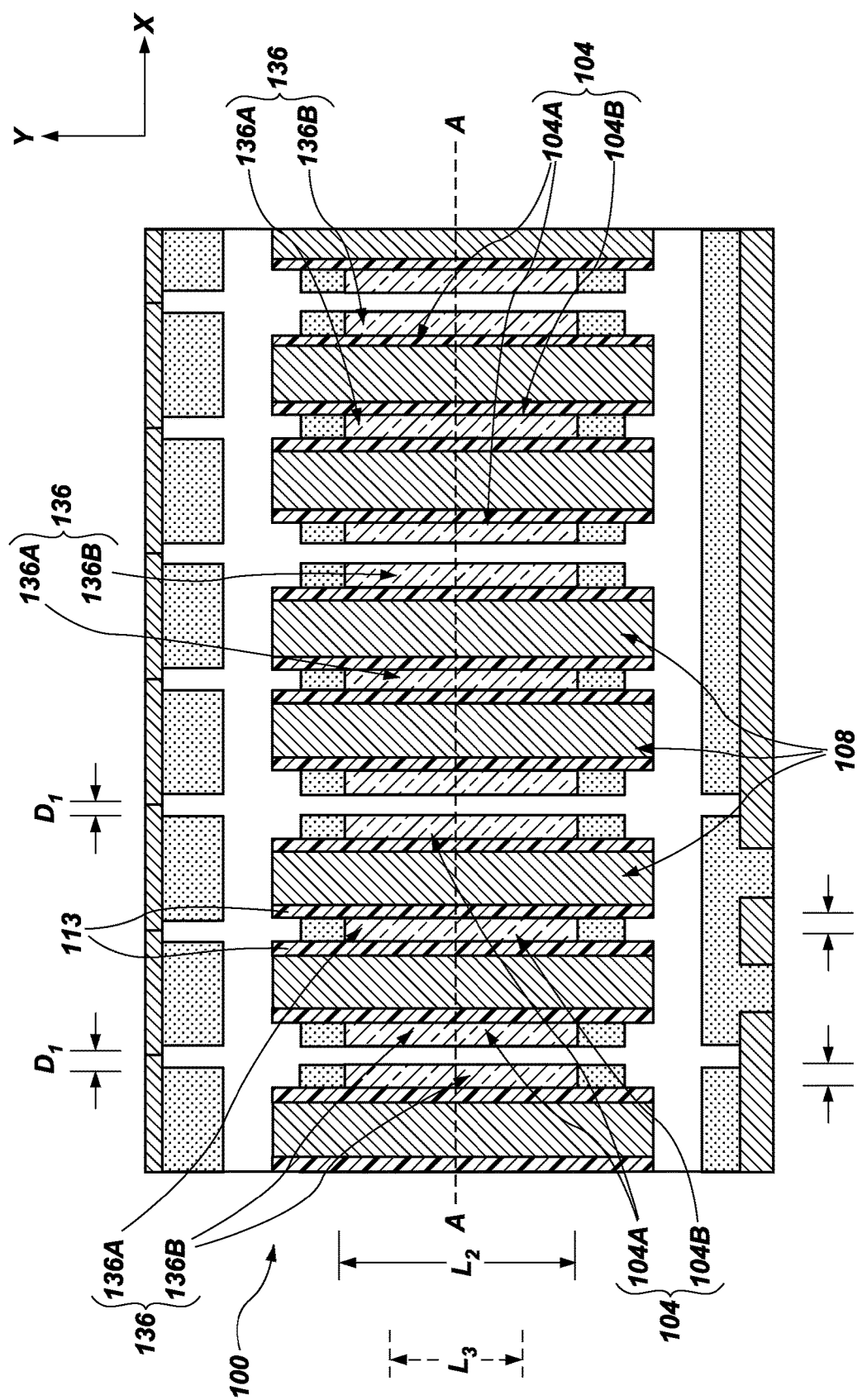
Figure 5B:
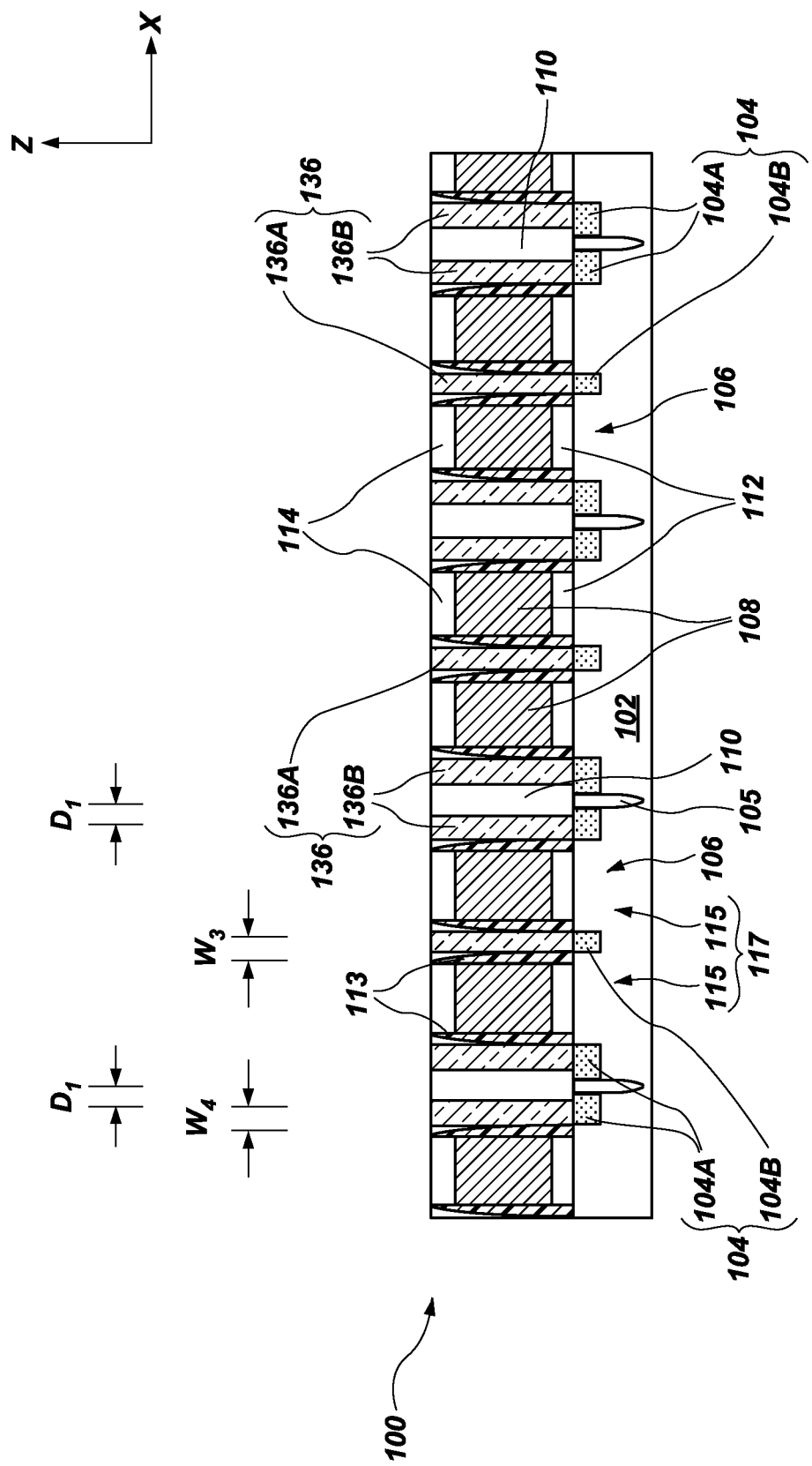

Referring next to FIG. 5A, portions of the isolation structures 110 (FIG. 4B) remaining uncovered by the material of the patterned first masking structure 130 may be selectively removed, and contact structures 136 may be formed with the resulting trenches. The contact structures 136 may be formed to contact (e.g., physically contact, electrically contact) the conductively-doped regions 104 (e.g., the drain regions 104A, the source regions 104B) of the base structure 102, and may be isolated from the gate structures 108 and one another by remaining (e.g., unremoved) portions of the isolation structures 110. The linear portions 134 (e.g., the first linear portions 134A, the second linear portions 134B) (FIGS. 4A and 4B) of the patterned first masking structure 130 (FIGS. 4A and 4B) may protect portions of the isolation structures 110 thereunder from removal during the material removal process to ensure the contact structures 136 are electrically isolated from one another and the gate structures 108. FIG. 5B is a simplified partial cross-sectional view of the microelectronic device structure 100 (about the line A-A) at the processing stage shown in FIG. 5A. For clarity and ease of understanding of the drawings and related description, not all features depicted in one of FIGS. 5A and 5B are depicted in the other of FIGS. 5A and 5B.

The contact structures 136 may be formed of and include at least one electrically conductive material, such as a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped Ge, conductively-doped SiGe), a conductive metal-containing material (e.g., a conductive metal nitride, a conductive metal silicide, a conductive metal carbide, a conductive metal oxide), or combinations thereof. The contact structures 136 may include substantially homogeneous distributions of the electrically conductive material, or may include substantially heterogeneous distributions of the electrically conductive material. If the contact structures 136 exhibit substantially heterogeneous distributions of the electrically conductive material, amounts of the electrically conductive material may vary stepwise (e.g., change abruptly), or may vary continuously (e.g., change progressively, such as linearly, parabolically) throughout different portions of the contact structures 136. In some embodiments, the contact structures 136 each exhibit a substantially homogeneous distribution of electrically conductive material. In additional embodiments, one or more (e.g., each) of the contact structures 136 exhibits a substantially heterogeneous distribution of at least one electrically conductive material. One or more of the contact structures 136 may, for example, be formed of and include a stack of at least two different electrically conductive materials.

As shown in FIGS. 5A and 5B, the contact structures 136 include source contact structures 136A and drain contact structures 136B. The source contact structures 136A may horizontally overlap and contact (e.g., physically contact, electrically contact) the source regions 104B of the base structure 102, and the drain contact structures 136B may horizontally overlap and contact (e.g., physically contact, electrically contact) the drain regions 104A of the base structure 102. In some embodiments, the source contact structures 136A are each individually confined within horizontal boundaries (e.g., in the X-direction and the Y-direction) of one of the source regions 104B of the base structure 102, and the drain contact structures 136B are each individually confined within horizontal boundaries (e.g., in the X-direction and the Y-direction) of one of the drain regions 104A of the base structures. The source contact structures 136A may be substantially horizontally aligned with and may partially horizontally extend over the source regions 104B of the base structure 102, and the drain contact structures 136B may be substantially horizontally aligned with and may partially horizontally extend over the drain regions 104A of the base structure 102. As shown in 5A, in some embodiments, each of the source contact structures 136A is individually substantially horizontally centered about one of the source regions 104B of the base structure 102 in the X-direction and the Y-direction, and each of the drain contact structures 136B is individually substantially horizontally centered about one of the drain regions 104A of the base structure 102 in the X-direction and the Y-direction. The contact structures 136 (including the source contact structures 136A and the drain contact structures 136B) may be offset from one another in the X-direction, and may be substantially aligned with one another in the Y-direction.

As shown in FIG. 5A, the contact structures 136 (including the source contact structures 136A and drain contact structures 136B) each individually exhibit a rectangular horizontal cross-sectional shape. The source contact structures 136A may each individually exhibit the third width $W_3$ (e.g., horizontal dimension in the X-direction) of the first additional trenches 132A (FIGS. 4A and 4B) in the patterned first masking structure 130 (FIGS. 4A and 4B) used to form the source contact structures 136A. In addition, the drain contact structures 136B may each individually exhibit the fourth width $W_4$ (e.g., horizontal dimension in the X-direction) of the second additional trenches 132B (FIGS. 4A and 4B) in the patterned first masking structure 130 (FIGS. 4A and 4B) used to form the drain contact structures 136B. In addition, as shown in FIG. 5A, each of the contact structures 136 (e.g., each of the source contact structures 136A and each of the drain contact structures 136B) may individually exhibit a length (e.g., a horizontal dimension in the Y-direction) corresponding (e.g., substantially the same as, equal to) a length of the additional trench 132 (e.g., the first additional trench 132A or the second additional trench 132B) (FIGS. 4A and 4B) in the patterned first masking structure 130 (FIGS. 4A and 4B) used to form the contact structures 136. As a non-limiting example, if each of the additional trenches 132 (FIGS. 4A and 4B) in the patterned first masking structure 130 (FIGS. 4A and 4B) is formed to exhibit the second length $L_2$, each of the contact structures 136 may also be formed to exhibit the second length $L_2$. As another non-limiting example, if the first additional trenches 132A (FIGS. 4A and 4B) in the patterned first masking structure 130 are each formed to exhibit the third length $L_3$ and the second additional trenches 132B (FIGS. 4A and 4B) in the patterned first masking structure 130 are each formed to exhibit the second length $L_2$, the source contact structures 136A may each be formed to exhibit the third length $L_3$ and the drain contact structures 136B may each be formed to exhibit the second length $L_2$. As a further non-limiting example, if the first additional trenches 132A in the patterned first masking structure 130 are each formed to exhibit the second length $L_2$ and the second additional trenches 132B in the patterned first masking structure 130 are each formed to exhibit the third length $L_3$, the source contact structures 136A may each be formed to exhibit the second length $L_2$ and the drain contact structures 136B may each be formed to exhibit the third length $L_3$. A horizontal distance between horizontally-neighboring drain contact structures 136B may be substantially equal to the width of each of the second linear portions 134B of the patterned first masking structure 130 (FIGS. 4A and 4B). A horizontal distance between each drain contact structure 136B and each source contact structure 136A horizontally-neighboring the drain contact structure 136B may be substantially equal to the width of each of the first linear portions 134A of the patterned first masking structure 130 (FIGS. 4A and 4B).

The contact structures 136 may be formed using conventional processes (e.g., conventional material removal processes and conventional material deposition processes) and conventional processing equipment, which are not described in detail herein. As a non-limiting example, the patterned first masking structure 130 (FIGS. 4A and 4B) may be used as a mask (e.g., a hard mask) for at least one etching process (e.g., an anisotropic etching process, such as an reactive ion etching process) to substantially remove unmasked portions of the isolation structures 110 thereunder (e.g., portions of the isolation structures 110 not covered by material of the patterned first masking structure 130, such as portions of the isolation structures 110 within horizontal boundaries of the additional trenches 132 (FIGS. 4A and 4B) within the patterned first masking structure 130). The unmasked portions of the isolation structures 110 may be substantially (e.g., completely) removed, while substantially maintaining the masked portions (e.g., portions covered by the material of the patterned first masking structure 130) of the isolation structures 110. An electrically conductive material may subsequently be formed (e.g., through one or more conventional deposition processes, such as one or more of an ALD process, a CVD process, a PECVD process, a PVD process, and a spin-coating process) inside and outside of the resulting trenches in the isolation structures 110, and then at least the electrically conductive material may be subjected to at least one planarization process (e.g., at least one CMP process) to at least remove portions of the electrically conductive material positioned above upper vertical boundaries (e.g., in the Z-direction) of the isolation structures 110 and form the contact structures 136.

The methods of the disclosure permit at least the drain contact structures 136B of the disclosure to exhibit greater horizontal dimensions (e.g., at least a greater length, such as the length $L_2$ shown in FIG. 5A) than conventional drain contact structures formed through conventional methods. As a result of the relatively greater horizontal dimensions thereof, the drain contact structures 136B facilitate reduced contact resistance and increased drain current ($I_{DS}$) as compared to conventional drain contact structures, which may improve performance in microelectronic devices (e.g., memory devices) including the microelectronic device structure 100.

Thus, in accordance with embodiments of the disclosure, a method of forming a microelectronic device comprises forming a spacer structure having a rectangular ring horizontal cross-sectional shape over a transistor, a portion of the spacer structure horizontally overlapping a drain region of the transistor. A masking structure is formed over the spacer structure and the transistor, the masking structure exhibiting an opening therein horizontally overlapping the drain region of the transistor and the portion of the spacer structure. A portion of an isolation structure overlying the drain region of the transistor is removed using the masking structure and the portion of the spacer structure as etching masks to form a trench vertically extending through the isolation structure to the drain region of the transistor. A drain contact structure is formed within the trench in the isolation structure.

Moreover, in accordance with additional embodiments of the disclosures, a method comprises forming a spacer structure in a ring shape over a transistor, the transistor comprising first and second conductively-doped regions and a gate structure over a channel region between the first and second conductively-doped regions, a portion of the spacer structure overlapping the first conductively-doped region. A masking structure is formed over the spacer structure and the transistor, the masking structure exhibiting an opening therein overlapping the first conductively-doped region and the portion of the spacer structure. A portion of an isolation structure overlying the first conductively-doped region is removed using the masking structure and the portion of the spacer structure as etching masks to form a trench exposing a part of the first conductively-doped region. A first contact structure is formed in contact with the part of the first conductively-doped region through the trench.

Furthermore, a microelectronic device according to embodiments of the disclosure comprises a transistor, a source contact structure, and a drain contact structure. The transistor comprises a gate structure, a source region horizontally neighboring a first side of the gate structure, a drain region horizontally neighboring a second side of the gate structure opposing the first side of the gate structure, and a channel region vertically underlying the gate structure and horizontally intervening between the source region and the drain region. The source contact structure horizontally neighbors the first side of the gate structure of the transistor and is in contact with the source region of the transistor. The drain contact structure horizontally neighbors the second side of the gate structure of the transistor and is in contact with the drain region of the transistor. The drain contact structure is substantially horizontally aligned with the source contact structure and exhibits a horizontal area greater than or equal to that of the source contact structure.

One of ordinary skill in the art will appreciate that, in accordance with additional embodiments of the disclosure, the process steps, features, and feature configurations described above in relation to one or more of FIGS. 1A through 5B may be readily adapted to the design needs of different microelectronic devices (e.g., different memory devices, such as different DRAM devices). By way of non-limiting example, FIGS. 6A and 6B are simplified top-down (FIG. 6A) and partial cross-sectional (FIG. 6B) views illustrating embodiments of a method of forming another microelectronic device structure of the disclosure. The microelectronic device structure 200 may be formed in a similar manner as and may exhibit similar features (e.g., structures, materials) to the microelectronic device structure 100 up through the processing stage previously described herein with reference to FIGS. 3A and 3B. However, the configurations and spacing of one or more features of the microelectronic device structure 200 may be modified in relation relations to those previously described with references to FIGS. 1A through 5B to accommodate desirable configurations and/or spacing in the microelectronic device structure 200. Throughout FIGS. 6A and 6B and the associated description below, features (e.g., structures, materials) of the microelectronic device structure 200 functionally similar features of the microelectronic device structure 100 (FIGS. 1A through 5B) are referred to with similar reference numerals incremented by 100. To avoid repetition, not all features shown in FIGS. 6A and 6B are described in detail herein. Rather, unless described otherwise below, a feature designated by a reference numeral that is a 100 increment of the reference numeral of a feature previously-described with reference to one or more of FIGS. 1A through 5B will be understood to be substantially similar to the previously-described feature. In addition, for clarity and ease of understanding of the drawings and related description, not all features depicted in one of FIGS. 6A and 6B are depicted in the other of FIGS. 6A and 6B.

Referring collectively to FIGS. 6A and 6B, the method of forming the microelectronic device structure 200 may employ different configurations and positions of the spacer structure 222 and the third masking pattern 226 as compared to the configurations and positions of the spacer structures 122 and the third masking structure 126 used to form the microelectronic device structure 100 through the processing stage depicted in FIGS. 3A and 3B. For example, the spacer structure 222 may horizontally overlap the gate structure 208 and portions one or more of the sidewall spacer structures 213 and the isolation structures 210 horizontally proximate to the gate structure 208, and the linear portions 229 of the third masking structure 226 may horizontally overlap regions of the base structure 202 outwardly horizontally adjacent (e.g., in the X-direction) the conductively-doped regions 204 (e.g., the drain region 204A, the source region 204B) of the base structure 202. The portions of spacer structure 222 within horizontal boundaries (e.g., in the X-direction and the Y-direction shown in FIG. 6A) of the trenches 228 in the third masking structure 226 may be substantially horizontally aligned with the gate structure 208 in the X-direction, and may horizontally extend in the X-direction completely over the gate structure 208 and at least over portions of the sidewall spacer structures 213 (and, optionally, the isolation structures 210) horizontally neighboring the gate structure 208. In some embodiments, portions of the spacer structure 222 within horizontal boundaries of the trenches 228 in the third masking structure 226 are substantially horizontally centered about the gate structure 208 in the X-direction. In addition, the linear portions 229 of the third masking structure 226 may each individually partially horizontally extend over one of the isolation structures 210 in the X-direction.

Following the processing step depicted in FIGS. 6A and 6B, the microelectronic device structure 200 may be subjected to additional processing acts to form contact structures (e.g., a drain contact structure, a source contact structure) in contact (e.g., physical contact, electrical contact) with the conductively-doped regions 204 (e.g., the drain region 204A, the source region 204B) of the base structure 202. The additional processing act may be similar to the processing acts previously described herein with reference to FIGS. 4A through 5B for the formation of the contact structures 136. For example, portions of the first masking structure 216 (FIG. 6B) not covered by one or more of the spacer structures 222 and the third masking structure 226 may be removed to form a patterned first masking structure, portions of the isolation structures 210 (FIG. 6B) remaining uncovered by the material of the patterned first masking structure may be selectively removed to form trenches in the isolation structures 210 vertically extending to the conductively-doped regions 204 of the base structure 202, and then contact structures similar to the contact structures 136 (FIGS. 5A and 5B) may be formed within the trenches in the isolation structures 210.

Figure 7:
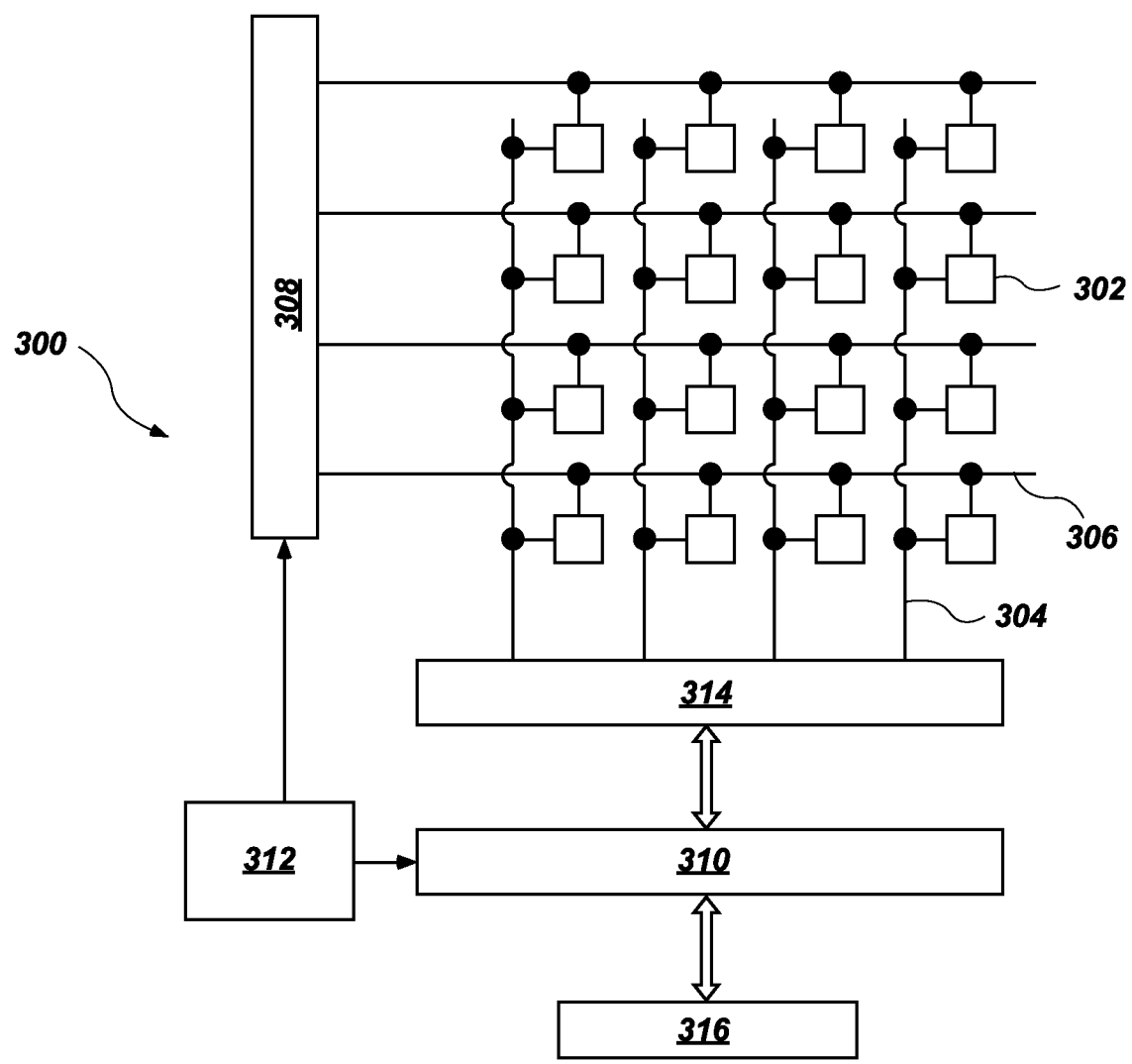
FIG. 7 is a functional block diagram of a memory device, in accordance with an embodiment of the disclosure.

Microelectronic device structures of the disclosure (e.g., the microelectronic device structure 100 shown in FIGS. 5A and 5B) formed using the methods of the disclosure may be employed in microelectronic devices (e.g., memory devices) of the disclosure. As a non-limiting example, FIG. 7 illustrates a functional block diagram of a memory device 300, in accordance with an embodiment of the disclosure. The memory device 300 may include, for example, an embodiment of the microelectronic device structure 100 previously described herein with reference to FIGS. 5A and 5B. As shown in FIG. 7, the memory device 300 may include memory cells 302, digit lines 304, word lines 306, a row decoder 308, a column decoder 310, a memory controller 312, a sense device 314, and an input/output device 316.

The memory cells 302 of the memory device 300 are programmable to at least two different logic states (e.g., logic 0 and logic 1). Each memory cell 302 may individually include a capacitor and transistor (e.g., a pass transistor). The capacitor stores a charge representative of the programmable logic state (e.g., a charged capacitor may represent a first logic state, such as a logic 1; and an uncharged capacitor may represent a second logic state, such as a logic 0) of the memory cell 302. The transistor grants access to the capacitor upon application (e.g., by way of one of the word lines 306) of a minimum threshold voltage to a semiconductive channel thereof for operations (e.g., reading, writing, rewriting) on the capacitor.

The digit lines 304 are connected to the capacitors of the memory cells 302 by way of the transistors of the memory cells 302. The transistors of the memory cells 302 may include, for example, an embodiment of the microelectronic device structure 100 previously described herein with reference to FIGS. 5A and 5B. The word lines 306 extend perpendicular to the digit lines 304, and are connected to gates of the transistors of the memory cells 302. Operations may be performed on the memory cells 302 by activating appropriate digit lines 304 and word lines 306. Activating a digit line 304 or a word line 306 may include applying a voltage potential to the digit line 304 or the word line 306. Each column of memory cells 302 may individually be connected to one of the digit lines 304, and each row of the memory cells 302 may individually be connected to one of the word lines 306. Individual memory cells 302 may be addressed and accessed through the intersections (e.g., cross points) of the digit lines 304 and the word lines 306.

The memory controller 312 may control the operations of memory cells 302 through various components, including the row decoder 308, the column decoder 310, and the sense device 314 (e.g., local I/O device). The memory controller 312 may generate row address signals that are directed to the row decoder 308 to activate (e.g., apply a voltage potential to) predetermined word lines 306, and may generate column address signals that are directed to the column decoder 310 to activate (e.g., apply a voltage potential to) predetermined digit lines 304. The sense device 314 may include sense amplifiers configured and operated to receive digit line inputs from the digit lines selected by the column decoder 310 and to generate digital data values during read operations. The sense device 314 may include, for example, an embodiment of the microelectronic device structure 100 previously described herein with reference to FIGS. 5A and 5B. The memory controller 312 may also generate and control various voltage potentials employed during the operation of the memory device 300. In general, the amplitude, shape, and/or duration of an applied voltage may be adjusted (e.g., varied), and may be different for various operations of the memory device 300.

During use and operation of the memory device 300, after being accessed, a memory cell 302 may be read (e.g., sensed) by the sense device 314. The sense device 314 may compare a signal (e.g., a voltage) of an appropriate digit line 304 to a reference signal in order to determine the logic state of the memory cell 302. If, for example, the digit line 304 has a higher voltage than the reference voltage, the sense device 314 may determine that the stored logic state of the memory cell 302 is a logic 1, and vice versa. The sense device 314 may include transistors and amplifiers to detect and amplify a difference in the signals (commonly referred to in the art as "latching"). The detected logic state of a memory cell 302 may be output through the column decoder 310 to the input/output device 316. In addition, a memory cell 302 may be set (e.g., written) by similarly activating an appropriate word line 306 and an appropriate digit line 304 of the memory device 300. By controlling the digit line 304 while the word line 306 is activated, the memory cell 302 may be set (e.g., a logic value may be stored in the memory cell 302). The column decoder 310 may accept data from the input/output device 316 to be written to the memory cells 302. Furthermore, a memory cell 302 may also be refreshed (e.g., recharged) by reading the memory cell 302. The read operation will place the contents of the memory cell 302 on the appropriate digit line 304, which is then pulled up to full level (e.g., full charge or discharge) by the sense device 314. When the word line 306 associated with the memory cell 302 is deactivated, all of memory cells 302 in the row associated with the word line 306 are restored to full charge or discharge.

Thus, a memory device according to embodiments of the disclosure comprises memory cells operably coupled to digit lines and word lines, and a memory controller operably coupled to the memory cells. The memory controller comprises a sense device comprising a transistor, a source contact structure in contact with a source region of the transistor, and a drain contact structure in contact with a drain region of the transistor. The drain contact structure has a length greater than or equal to a length of the source contact structure.

Figure 8:
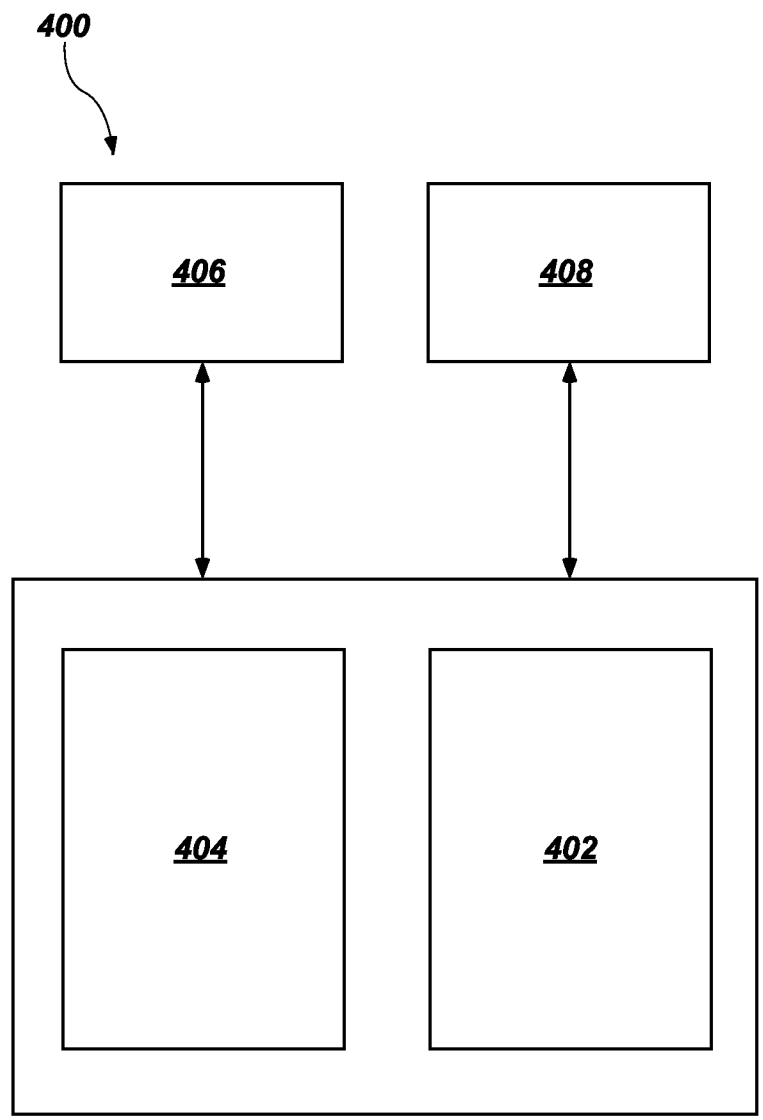
FIG. 8 is a schematic block diagram of an electronic system, in accordance with an embodiment of the disclosure.

Microelectronic devices (e.g., the memory device 300 shown in FIG. 7) including microelectronic device structures (e.g., the microelectronic device structure 100 shown in FIGS. 5A and 5B) in accordance with embodiments of the disclosure may be used in embodiments of electronic systems of the disclosure. For example, FIG. 8 is a block diagram of an illustrative electronic system 400 according to embodiments of disclosure. The electronic system 400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 400 includes at least one memory device 402. The memory device 402 may comprise, for example, an embodiment of a microelectronic device (e.g., the memory device 300 shown in FIG. 7) previously described herein. The electronic system 400 may further include at least one electronic signal processor device 404 (often referred to as a "microprocessor"). The electronic signal processor device 404 may, optionally, include an embodiment a microelectronic device (e.g., the microelectronic device 300 shown in FIG. 7) previously described herein. While the memory device 402 and the electronic signal processor device 404 are depicted as two (2) separate devices in FIG. 8, in additional embodiments, a single (e.g., only one) memory/processor device having the functionalities of the memory device 402 and the electronic signal processor device 404 is included in the electronic system 400. In such embodiments, the memory/processor device may include an embodiment of a microelectronic device structure (e.g., the microelectronic device structure 100 shown in FIGS. 5A and 5B) previously described herein, and/or an embodiment of a microelectronic device (e.g., the memory device 300 shown in FIG. 7) previously described herein. The electronic system 400 may further include one or more input devices 406 for inputting information into the electronic system 400 by a user, such as, for example, a mouse or other pointing device, a keyboard, a touchpad, a button, or a control panel. The electronic system 400 may further include one or more output devices 408 for outputting information (e.g., visual or audio output) to a user such as, for example, a monitor, a display, a printer, an audio output jack, a speaker, etc. In some embodiments, the input device 406 and the output device 408 may comprise a single touchscreen device that can be used both to input information to the electronic system 400 and to output visual information to a user. The input device 406 and the output device 408 may communicate electrically with one or more of the memory device 402 and the electronic signal processor device 404.

Thus, an electronic system according to embodiments of the disclosure comprises an input device, an output device, a processor device operably coupled to the input device and the output device, and a memory device operably coupled to the processor device. The memory device comprises a first transistor, a first source contact structure, a first drain contact structure, a second transistor, a second source contact structure, and a second drain contact structure. The first source contact structure horizontally neighbors a first side of a first gate structure of the first transistor and contacts a first source region of the first transistor. The first drain contact structure horizontally neighbors a second side of the first gate structure of the first transistor and contacts a first drain region of the first transistor. The second transistor horizontally neighbors the first transistor. The second source contact structure horizontally neighbors a first side of a second gate structure of the second transistor and contacts a second source region of the second transistor. The second drain contact structure horizontally neighbors a second side of the second gate structure of the second transistor and contacts a second drain region of the second transistor. The second drain contact structure horizontally neighbors the first drain contact structure in a first direction and is substantially horizontally aligned with the first drain contact structure in a second direction perpendicular to the first direction.

The methods of the disclosure provide an effective and reliable way to manipulate the dimensions, shapes, and spacing of contact structures (e.g., the contact structures 136 shown in FIGS. 5A and 5B, including the source contact structures 136A and the drain contact structures 136B) of microelectronic device structures (e.g., the microelectronic device structure 100 shown in FIGS. 5A and 5B) of a microelectronic device (e.g., a memory device, such as the memory device 300 shown in FIG. 7). The methods of the disclosure facilitate the simple and cost-effective formation of contact structures effectuating reduced contact resistance and increased drive current as compared to conventional contact structures, while reducing the risk of undesirable current leakage and short circuits as compared to conventional contact structure configurations. The methods and structures of the disclosure may facilitate increased reliability and performance in microelectronic devices (e.g., memory devices, such as DRAM devices) and electronic systems that rely on high feature density.

While the disclosure is susceptible to various modifications and alternative forms, specific embodiments have been shown by way of example in the drawings and have been described in detail herein. However, the disclosure is not intended to be limited to the particular forms disclosed. Rather, the disclosure is to cover all modifications, equivalents, and alternatives falling within the scope of the disclosure as defined by the following appended claims and their legal equivalents.

What is claimed is:

1. A method of forming a microelectronic device, comprising:
    forming a spacer structure having a rectangular ring horizontal cross-sectional shape over a transistor, a portion of the spacer structure horizontally overlapping a drain region of the transistor;
    forming a masking structure over the spacer structure and the transistor, the masking structure exhibiting an opening therein horizontally overlapping the drain region of the transistor and the portion of the spacer structure;
    removing a portion of an isolation structure overlying the drain region of the transistor using the masking structure and the portion of the spacer structure as etching masks to form a trench vertically extending through the isolation structure to the drain region of the transistor; and
    forming a drain contact structure within the trench in the isolation structure.

2. The method of claim 1, wherein forming a spacer structure comprises:
    forming another masking structure over the transistor, the another masking structure exhibiting a rectangular opening therein horizontally overlapping the transistor;
    forming a spacer material over surfaces inside and outside of the rectangular opening in the another masking structure; and
    removing portions of the spacer material outside of the rectangular opening in the another masking structure and along a lower vertical boundary of the rectangular opening to form the spacer structure.

3. The method of claim 2, further comprising removing remaining portions of the another masking structure after forming the spacer structure.

4. The method of claim 1, wherein removing a portion of an isolation structure overlying the drain region comprises:
    removing a portion of an additional masking structure vertically intervening between the isolation structure and each of the masking structure and the portion of the spacer structure using the masking structure and the portion of the spacer structure as etching masks to form a patterned additional masking structure exhibiting an additional opening within horizontal boundaries of the isolation structure; and
    removing the portion of the isolation structure using the patterned additional masking structure as an etching mask to form the trench in the isolation structure.

5. The method of claim 1, wherein forming a drain contact structure within the trench in the isolation structure comprises:
    forming an electrically conductive material on surfaces inside and outside of the trench in the isolation structure; and
    removing portions of the electrically conductive material outside of boundaries of trench in the isolation structure to form the drain contact structure.

6. The method of claim 1, wherein forming a spacer structure further comprises forming the portion of the spacer structure to horizontally intervene between the drain region of the transistor and another drain region of another transistor horizontally neighboring the transistor.

7. The method of claim 6, further comprising forming another portion of the spacer structure to horizontally intervene between an additional drain region of an additional transistor and a further drain region of a further transistor horizontally neighboring the additional transistor.

8. The method of claim 6, wherein forming a masking structure comprises forming the opening in masking structure to horizontally overlap the drain region of the transistor, the portion of the spacer structure, and the another drain region of the another transistor.

9. The method of claim 8, further comprising forming the masking structure to exhibit another opening therein horizontally overlapping a source region of the transistor.

10. The method of claim 8, further comprising removing another portion of the isolation structure overlying the another drain region of the another transistor using the masking structure and the portion of the spacer structure as etching masks to form another trench vertically extending through the isolation structure to the another drain region of the another transistor, an additional portion of the isolation structure horizontally interposed between the trench in the isolation structure and the another trench in the isolation structure.

11. The method of claim 10, further comprising forming another drain contact structure within the another trench in the isolation structure.

12. The method of claim 11, wherein forming another drain contact structure comprises forming the drain contact structure and the another drain contact structure to exhibit substantially equal horizontal dimensions as one another and to be substantially horizontally aligned with one another.

13. The method of claim 1, wherein forming a spacer structure further comprises forming the portion of the spacer structure to horizontally overlap a source region of the transistor and a gate structure of the transistor horizontally intervening between the source region of the transistor and the drain region of the transistor.

14. The method of claim 13, wherein forming a masking structure comprises forming the opening in masking structure to horizontally overlap the source region of the transistor, the gate structure of the transistor, the drain region of the transistor, and the portion of the spacer structure.

15. The method of claim 14, further comprising removing portion of another isolation structure overlying the source region of the transistor using the masking structure and the portion of the spacer structure as etching masks to form another trench vertically extending through the another isolation structure to the source region of the transistor.

16. The method of claim 15, further comprising forming a source contact structure within the another trench in the another isolation structure.

17. The method of claim 16, wherein forming a source contact structure comprises forming the source contact structure and the drain contact structure to exhibit substantially equal horizontal dimensions as one another and to be substantially horizontally aligned with one another.

18. A method, comprising:
    forming a spacer structure in a ring shape over a transistor, the transistor comprising first and second conductively-doped regions and a gate structure over a channel region between the first and second conductively-doped regions, a portion of the spacer structure overlapping the first conductively-doped region;
    forming a masking structure over the spacer structure and the transistor, the masking structure exhibiting an opening therein overlapping the first conductively-doped region and the portion of the spacer structure;
    removing a portion of an isolation structure overlying the first conductively-doped region using the masking structure and the portion of the spacer structure as etching masks to form a trench exposing a part of the first conductively-doped region; and forming a first contact structure in contact with the part of the first conductively-doped region through the trench.

19. The method of claim 18, wherein forming a spacer structure comprises:
 forming another masking structure over the transistor, the another masking structure exhibiting an opening therein overlapping the transistor;
 forming a spacer material over surfaces inside and outside of the opening in the another masking structure; and
 removing selected portions of the spacer material to form the spacer structure.

20. The method of claim 18, wherein removing a portion of an isolation structure overlying the first conductively-doped region comprises:
 removing a portion of an additional masking structure intervening between the isolation structure and each of the masking structure and the portion of the spacer structure using the masking structure and the portion of the spacer structure as etching masks to form a patterned additional masking structure exhibiting an additional opening; and
 removing the portion of the isolation structure using the patterned additional masking structure as an etching mask to form the trench.

21. The method of claim 18, wherein forming a spacer structure further comprises forming the portion of the spacer structure to horizontally overlap a second conductively-doped region and the gate structure.

22. The method of claim 21, wherein forming a masking structure comprises forming the opening in the masking structure to overlap the second conductively-doped region, the gate structure, the first conductively-doped region, and the portion of the spacer structure.

23. The method of claim 22, further comprising removing a portion of another isolation structure overlying the second conductively-doped region using the masking structure and the portion of the spacer structure as etching masks to form another trench exposing a part of the second conductively-doped region.

24. The method of claim 23, further comprising forming a second contact structure in contact with the part of the second conductively-doped region through the another trench.

25. The method of claim 24, wherein forming a second contact structure comprises forming the second contact structure and the first contact structure to exhibit substantially equal horizontal dimensions as one another and to be substantially horizontally aligned with one another.

26. The method of claim 18, wherein the first conductively-doped region serves as a drain region and the second conductively-doped region serves as a source region.

* * * * *

UNITED STATES PATENT AND TRADEMARK OFFICE
CERTIFICATE OF CORRECTION

PATENT NO. : 10,985,165 B2  Page 1 of 1
APPLICATION NO. : 16/543799
DATED : April 20, 2021
INVENTOR(S) : Lee et al.

It is certified that error appears in the above-identified patent and that said Letters Patent is hereby corrected as shown below:

In the Specification
Column 8, Line 40, change "and includes Sift." to --and includes $SiO_2$--

Signed and Sealed this
Thirteenth Day of July, 2021

Drew Hirshfeld
*Performing the Functions and Duties of the
Under Secretary of Commerce for Intellectual Property and
Director of the United States Patent and Trademark Office*